(12) United States Patent
Yoneda et al.

(10) Patent No.: US 7,896,524 B2
(45) Date of Patent: Mar. 1, 2011

(54) LIGHT IRRADIATION APPARATUS

(75) Inventors: Kenji Yoneda, Kyoto (JP); Mitsuru Saito, Kyoto (JP)

(73) Assignees: CCS, Inc., Kyoto (JP); Mitsubishi Chemical Corporation, Tokyo (JP)

( * ) Notice: Subject to any disclaimer, the term of this patent is extended or adjusted under 35 U.S.C. 154(b) by 628 days.

(21) Appl. No.: 11/916,263

(22) PCT Filed: May 26, 2006

(86) PCT No.: PCT/JP2006/310565

§ 371 (c)(1),
(2), (4) Date: Nov. 30, 2007

(87) PCT Pub. No.: WO2006/129570

PCT Pub. Date: Dec. 7, 2006

(65) Prior Publication Data

US 2010/0014286 A1    Jan. 21, 2010

(30) Foreign Application Priority Data

Jun. 1, 2005    (JP) .......................... P2005-161873

(51) Int. Cl.
*F21V 17/02* (2006.01)

(52) U.S. Cl. .................. 362/282; 362/231; 362/245; 362/308

(58) Field of Classification Search .............. 362/231, 362/245, 282, 308
See application file for complete search history.

(56) References Cited

U.S. PATENT DOCUMENTS

| | | | | |
|---|---|---|---|---|
| 2,254,962 | A * | 9/1941 | Bitner et al. | ................ 362/327 |
| 5,630,661 | A | 5/1997 | Fox | |
| 6,536,923 | B1 | 3/2003 | Merz | |
| 6,799,987 | B1 | 10/2004 | Park et al. | |
| 6,905,224 | B2 | 6/2005 | Yoo et al. | |
| 2002/0159270 | A1 * | 10/2002 | Lynam et al. | ................ 362/492 |
| 2005/0095892 | A1 | 5/2005 | Fukuyama | |

FOREIGN PATENT DOCUMENTS

| | | |
|---|---|---|
| EP | 0 635 744 | 10/1993 |
| EP | 1 382 960 | 1/2004 |

(Continued)

*Primary Examiner*—Sandra L O Shea
*Assistant Examiner*—Meghan K Dunwiddie

(57) ABSTRACT

The invention provides a light irradiation apparatus that can adjust widening/narrowing of a light irradiation area and can guide almost whole of light emitted from an LED to the light irradiation area.

The apparatus has an LED 11 and an optical unit 2 for making light for the LED 11 pass through itself and emit from its apical surface 21, and is equipped further with a supporting body 1A for holding the LED on the apical surface and a position adjustment mechanism for adjusting a relative position of the optical unit 2 to the LED 11 along an optical axis C direction. The apparatus is configured so that the potion adjustment mechanism make the optical unit 2 move relative to the LED 11 between a proximity position P1 at which a part or the whole of the supporting body 1A is housed in a base end recess 25 and a clearance position P2 at which substantially whole of the supporting body 1A comes out of the base end recess 25 so that the apical surface of the supporting body 1A and a base end face 22 of the optical unit 2 become substantially the same height.

17 Claims, 22 Drawing Sheets

FOREIGN PATENT DOCUMENTS

| | | |
|---|---|---|
| EP | 1 548 356 | 6/2005 |
| JP | 06-044814 | 2/1994 |
| JP | 7-37401 | 2/1995 |
| JP | 7-58362 | 3/1995 |
| JP | 07-181484 | 7/1995 |
| JP | 2002-043629 | 2/2002 |
| JP | 2002-221658 | 8/2002 |
| JP | 2003-035883 | 2/2003 |
| JP | 2003-227974 | 8/2003 |
| JP | 2003-281907 | 10/2003 |
| JP | 2004-022257 | 1/2004 |
| JP | 2004-211503 | 7/2004 |
| JP | 2005-93622 | 4/2005 |
| KR | 1020010028394 | 4/2001 |
| WO | 01/98760 | 12/2001 |

\* cited by examiner (a)

(b)

(a)

(b)

(a)

(b)

(a)

(b)

LIGHT IRRADIATION APPARATUS

BACKGROUND OF THE INVENTION

1. Field of the Invention

The present invention relates to a light irradiation apparatus using an LED as a light source that is preferably used for spot illumination for product inspection, plant cultivation, or exhibits (pictures, foods, etc.).

2. Description of the Background Art

Recently, the high-intensity LED called the power LED, the blue LED, etc. have been developed, and along with these developments the LED are having greatly enlarged applications. For example, as a spot light irradiation apparatus for product inspection that is used for detecting flaws of a product and reading a mark thereof, conventional one using a halogen lamp as its light source has been used. However, in recent years, irradiation apparatuses each of which uses the LED that is superior in a life, luminous intensity stability, fast response, efficiency, etc. have been developed. Moreover, since the LED emits a less amount of heat and is also excellent in controllability, the LED has newly attracted attention also as the light source for plant cultivation.

On the other hand, in order to guide the light emitted from the LED to the forward, optical units as described in the following patent documents 1, 2 have been developed.

An optical unit of the patent document 1 (called an optical coupler) is for guiding light emitted from the LED to a light guide, such as a transparent rod, with as less waste as possible, being used mainly for dental medical treatment. This optical coupler is equipped with a bowl shape body that is transparent and solid, and a recess part is provided on a base end face of the body. Then the light emitted from the LED disposed in the recess undergoes total reflection on a curvilinear side of the body, or directly, and is emitted from an apical surface of the body. The apical surface of the body is made flat and is so configured that its apical surface is closely contacted with a light guiding face of the light guide and substantially whole of the light emitted from the LED is guided into the light guide.

An optical unit (called a lens body) of patent document 2 has a central prism part and an outer-ring prism part, being configured to receive all the light from the LED by the lens body and emit it to a predetermined direction.

If such an optical unit is made to be built in a spot light irradiation apparatus, an optical irradiation efficiency will be improved further. However, each of what were described focused only on efficiency of casting the light from the LED forward, it cannot make the size of the light irradiation area adjustable by making a distance between the LED and the optical unit variable.

Patent-document 1: Japanese Unexamined Patent Publication No. 2003-227974

Patent document 2: Japanese Unexamined Patent Publication No. 2002-43629

SUMMARY OF THE INVENTION

In view of this problem, the present invention provides a light irradiation apparatus that can perform adjustment of widening/narrowing a light irradiation area, and can guide almost whole of light emitted from an LED to a light irradiation area without a loss, as its main desired problem.

That is, the light irradiation apparatus according to the present invention has an LED and an integrated-type optical unit having optical transparency that allows the light from the LED to pass through its inside and emit from its apical surface, the optical unit has a rotating body shape centered on an optical axis of light emitted from the LED, further including a supporting body such that an opening is given to the base end recess for housing the LED in the central part of the base end face and a reflection plane for performing substantially total reflection of the light from the LED is formed on its side and that holds the LED on its apical surface, a position adjustment mechanism for adjusting a relative position of the optical unit to the LED along an optical axis direction, characterized in that the position adjustment mechanism makes the optical unit move relative to the LED between a proximity position at which a part or the whole of the supporting body is housed in its base end recess and a clearance position at which the apical surface of the supporting body and a base end face of the optical unit becomes substantially the same height when the substantially whole of the supporting body comes out of the base end recess.

If the light irradiation apparatus is such, the light irradiation area can be widened/narrowed by the position adjustment mechanism. Therefore, it is very suitable for product inspection where the widening/narrowing the diameter of the irradiation light depending on a work is required and for plant cultivation where an irradiation target varies in size due to its growth.

Moreover, since the reflection plane of the optical unit is sure to exist on the side of the LED whichever position the LED moves to by the position adjustment mechanism, the light from the LED that emits it in a range of ±90° at maximum can be surely reflected and can be effectively utilized.

In order to realize the position adjustment mechanism with a simple configuration, it is desirable that the position adjustment mechanism is so configured that the supporting body and the base end recess are made to fit each other substantially without looseness in a direction perpendicular to the optical axis and is configured to be slidable in the optical axis direction.

As a concrete embodiment, there can be enumerated a super high-intensity type to which a current of 200 mA or more can be continuously flowed as the above-mentioned LED.

In order to attain compactness of the optical unit and in order to partition a transmission area of light reflected by the reflection plane of the optical unit and a transmission area of light other than this, so that an optical design is made easy, the optical unit is suitable: the optical unit has a central refraction part in the central part, emits substantially all the light rays that undergo total reflection on the reflection plane among the light rays coming out from the LED without allowing them to pass through the central refraction part, and emits substantially all the light rays other than that light rays by making them pass through the central refraction part.

As a light irradiation apparatus suitable especially for concentrating spotlighting, there can be enumerated one such that the optical unit is formed so as to have a central convex lens part formed in its apical surface central part, a ring convex lens part of a different curvature formed on the periphery of the apical surface of the central convex lens part, and a curvilinear bulge surface that is a reflection plane formed on its side, wherein the light irradiation apparatus is so configured that, among the light rays emitted from the LED, substantially all the light rays passing through the side of the base end recess are configured to emit to the outside by undergoing total reflection as mutually converging light rays through the ring convex lens part, and substantially all the light rays passing through the bottom of the recess are configured to emit to the outside as mutually converging light rays through the central convex lens part.

In this configuration, if the convex lens part is formed on a bottom of the base end recess, refractivity at the central convex lens part can be made small, so that it becomes easy to make an optical design without unreasonable settings.

Preferably, one that is suitable for dispersion type spot illumination capable of being used for plant cultivation etc. is such that the optical unit is so configured that an apical recess is opened in its apical surface central part, a ring concave lens part is formed on the periphery of the apical surface of its apical recess, and a curvilinear bulge surface that is a reflection plane is formed on its side, wherein the light irradiation apparatus is so configured that, among the light rays emitted from the LED, substantially all the light rays passing though the apical recess are configured to emit to the outside as outwardly diverging light rays without allowing them to pass through the concave lens part, while substantially all the light rays not passing through the apical recess undergo total reflection on the curvilinear bulge surface are configured to pass through the concave lens part, and is made to emit to the outside as outwardly diverging light rays.

In this configuration, if the central convex lens part is formed in the bottom of the apical recess, the reasonable optical design becomes easy as well. Incidentally, a lens part or a lens indicates any part having a lens effect including a Fresnel lens etc. as well as the normal lens.

A desirable mode for the power LED is one such that the supporting body has a main body part and a bulge part that is provided on the main body part and has conductivity. There can be enumerated one such that the LED is joined on the bulge part using gold-tin solder and the bulge part is soldered onto the main body part.

It is preferable that the main body part has a lamination structure in which a wiring layer, an insulating layer, and a thermal conduction layer are laminated in this order from the apical surface, and the bulge part has a thermal expansion coefficient between a thermal expansion coefficient of the LED and a thermal expansion coefficient of the thermal conduction layer.

Moreover, the light irradiation apparatus according to the present invention has: an LED; a solid optical unit with optical transparency that is in the shape of a widening-toward-end rotating body with a center of the optical axis of the light emitted from the LED and makes the light from the LED pass through its inside and emit it from its apical surface: and a concave lens disposed in a further apical end side of the optical unit; wherein the optical unit is so configured that a reflection plane for performing substantially total reflection of the light from the LED on its side, and further includes a position adjustment mechanism for setting a clearance between the concave lens and the optical unit along the optical axis direction to be variable.

More specifically, it is preferable that the optical unit is configured as follows: the optical unit is so configured that a base end recess for housing the LED is opened in the central part of the base end face, a central convex lens part is formed in the center part on its apical surface, a ring convex lens part of a curvature different from that of the central convex lens part is formed on the periphery thereof, and a curvilinear bulge surface acting as a reflection plane for performing total reflection of the light from the LED is formed on its side, wherein among the light rays emitted from the LED, substantially all the light rays passing through the side of the base end recess are configured to undergo total reflection on the curvilinear bulge surface and emit to the outside as mutually converging light rays through the ring convex lens part, while substantially all the light rays passing through the bottom of the recess are configured to emit to the outside as mutually converging light rays through the central convex lens part.

Even being such an apparatus, since it can satisfy both widening/narrowing of the light irradiation area and efficient utilization of the light, the same effect as what was described above can be attained and it becomes suitable especially for product inspection, plant cultivation, etc. Moreover, an adjustable range for position adjustment can be taken a wide value and this characteristic makes fine adjustment easy.

When considering plant cultivation, vegetation lighting, etc., one that can irradiate light in a large area is required. For that purpose, it is desirable that the apparatus has a plurality of LED's provided in an arrangement, a plurality of optical units corresponding to these LED's, and a plurality of concave lenses corresponding to these optical units, wherein the position adjustment mechanism uniformly alters the clearances of respective concave lenses and respective optical units.

As a suitable mode of the position adjustment mechanism, there can be enumerated one such that the position adjustment mechanism makes the concave lens move relative to the optical unit between the clearance position at which the diameter of the light emitted from the optical unit becomes minimum or a position being its neighbor position and a proximity position being set further nearer the optical unit side than the clearance position.

At the clearance position, the diameter of the light emitted from the optical unit becomes roughly a minimum, the light is converged in a range where a curvature near the center of the concave lens is small and refraction power becomes a minimum. From there, the light rays pass through the concave lens and make cross, being little affected with refraction, and become most widened light rays. Therefore, an area near the center of the concave lens may be flat uniform-thickness shape, or a through hole may be formed in the near-central area. Especially, if the through hole is formed, attenuation of the light at the clearance position at which the light widens mostly and the illuminance becomes small can be inhibited as described above, and the effect becomes remarkable.

Specifically, what is necessary is just to provide a through hole or a uniform-thickness part in the center of the concave lens, and to configure so that substantially all the light rays coming out from the optical unit may pass through the through hole at the clearance position.

In a case where intensity loss of the light coming out from the central convex lens part is intended to be lessened as much as possible or in a case where the control with the concave lens is unnecessary, what is necessary is to provide a through hole or a uniform-thickness part in the center of the concave lens, and it is so configured that substantially all the light rays coming out from the central convex lens part may pass through the through hole or the uniform-thickness part.

In a case where a plurality of LEDs each having different emission color are mounted in a single optical unit in an assembly, or the apparatus has a plurality of optical units, it may be adopted that colors of the LEDs corresponding to the optical units are made different, whereby the emission intensity ratio of the LEDs is changed depending on an illumination target, for example, the illumination color is made adjustable to be a plurality of stages. If being such an apparatus, optimum illumination that matches an illumination target becomes able to be done, for example, the white color can be changed a little, from artificial white color to warm colored white color even in a case where the color is white, depending on illumination target, and therefore the apparatus becomes specially suitable as a spot illuminator.

Thus, according to the present invention, the light irradiation apparatus can adjust widening/narrowing of the light irradiation area and can guide almost all the light rays coming out from the LED to the light irradiation area without a loss can be provided.

DESCRIPTION OF THE PREFERRED EMBODIMENTS

Figure 1:
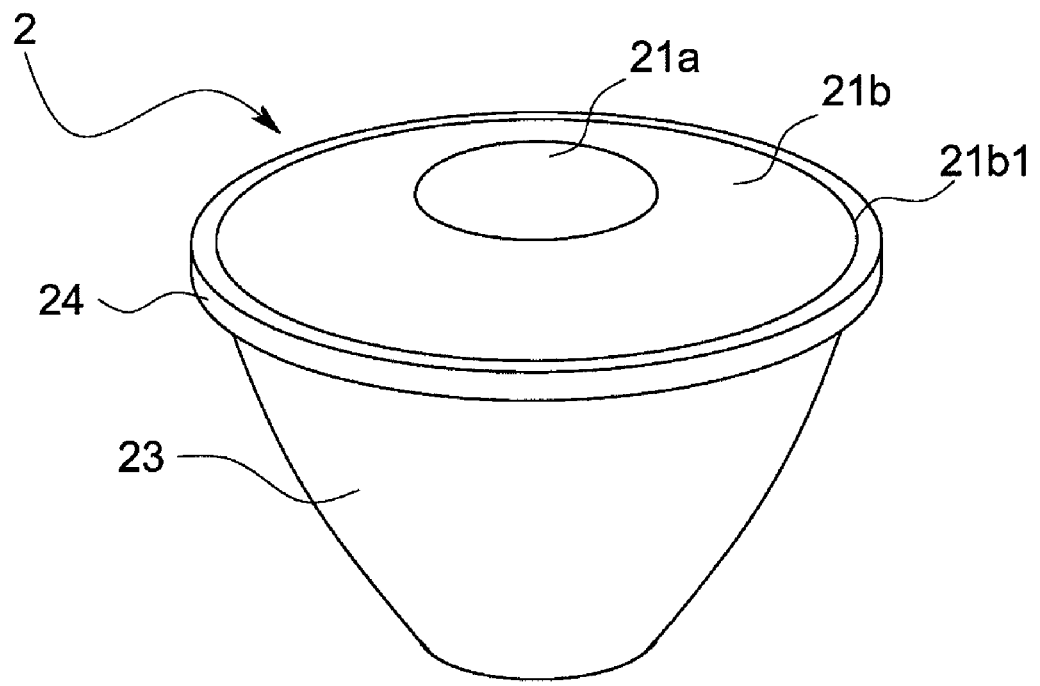
FIG. 1 is a perspective view showing separately an LED package and an optical unit in a first embodiment of the present invention.
Figure 1:
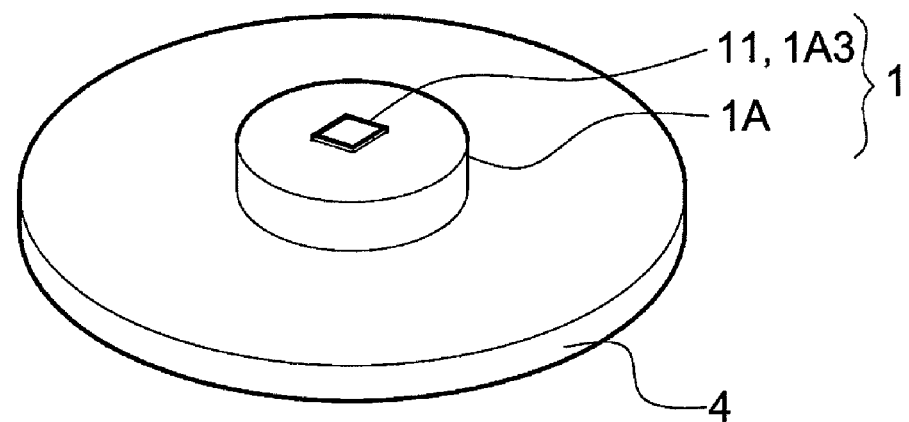

Hereafter, embodiments of the present invention will be described referring to the drawings.

First Embodiment

The light irradiation apparatus according to the present embodiment has an LED package 1 including an LED 11 that is a light source, an optical unit 2 that receives light emitted from the LED 11 and emits it from its apical surface 21, and an unillustrated casing for housing and holding these LED package 1 and optical unit 2.

The each part will be described in detail. The LED package 1 has a supporting body 1A and the LED 11 supported on an apical surface 1A1 of the supporting body 1A, and the both are fixed to the casing.

Figure 3:
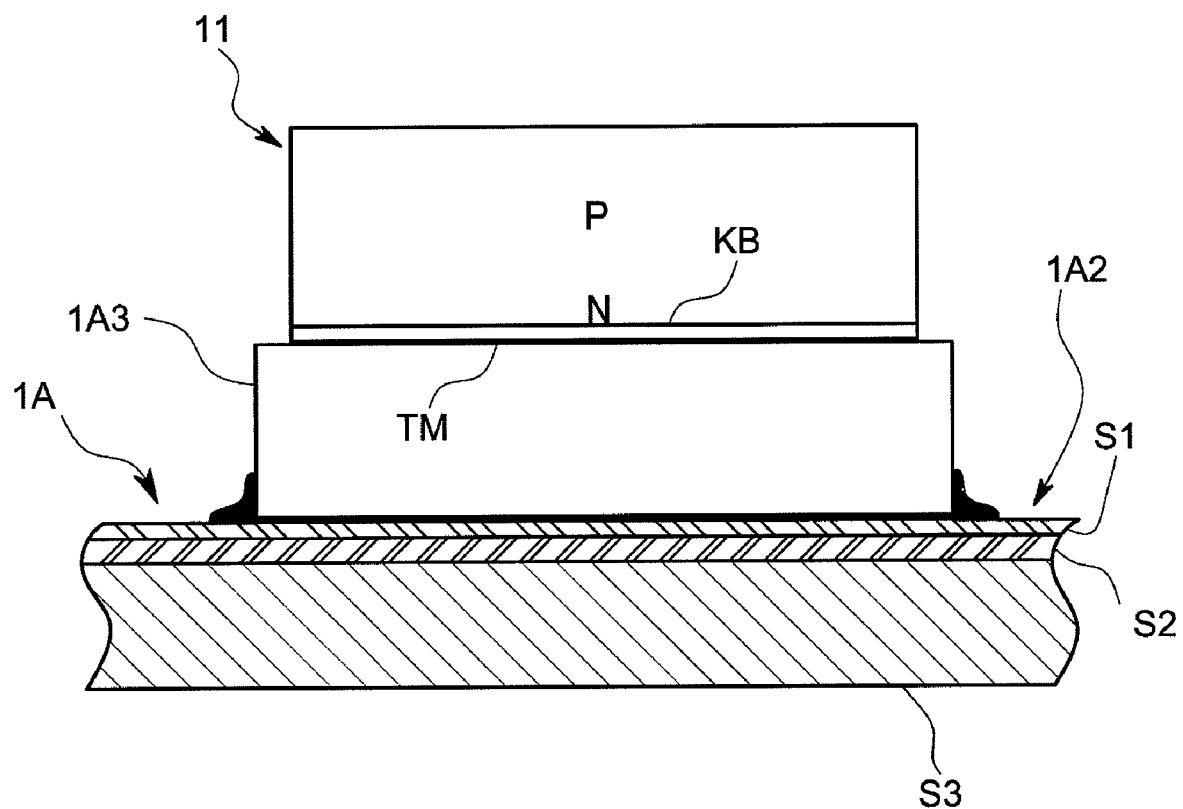
FIG. 3 is an enlarged sectional view showing the LED package in the embodiment.
Figure 4:
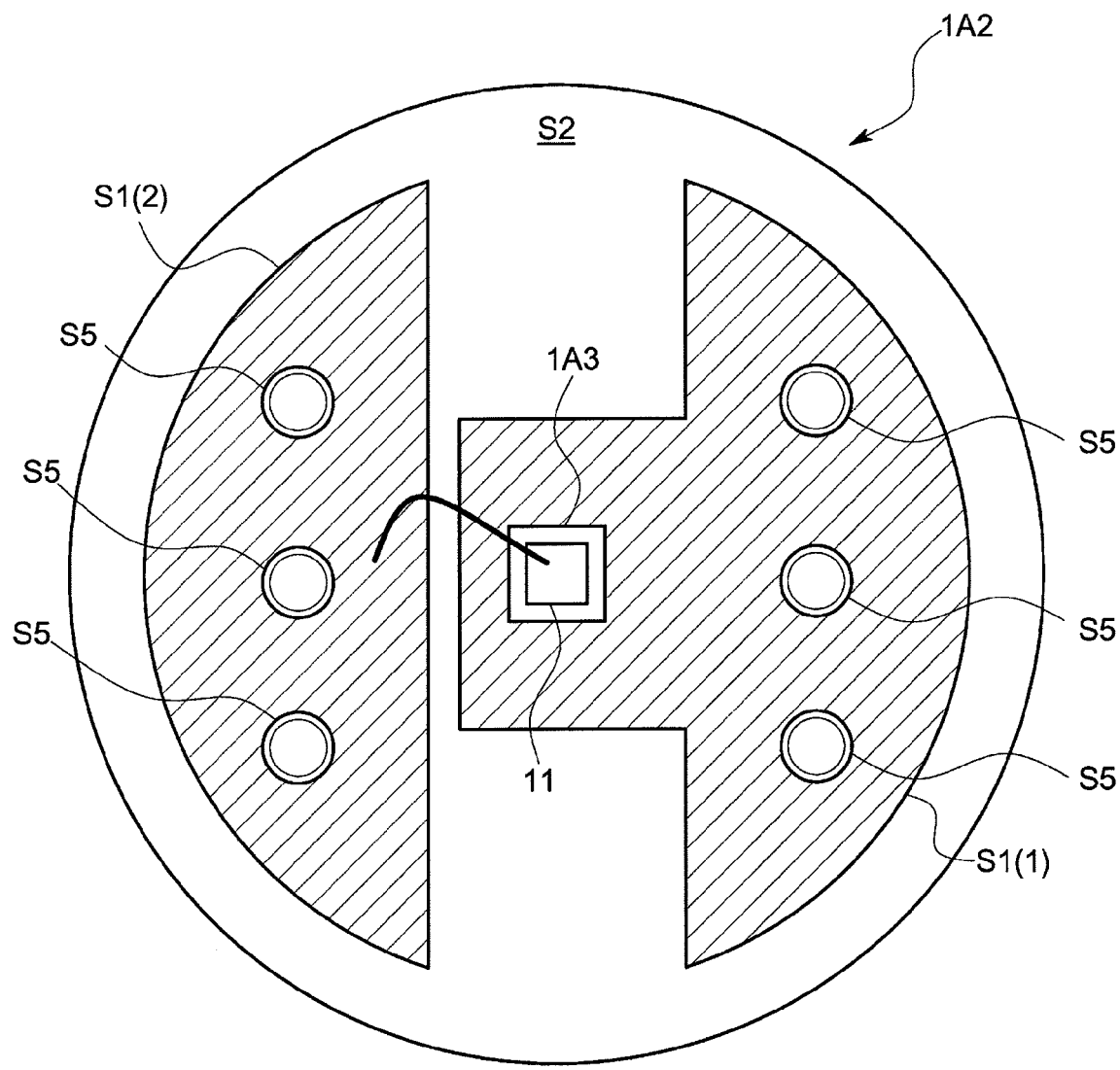
FIG. 4 is a plan view of a substrate in the embodiment.

The supporting body 1A is, as shown in FIGS. 3 and 4, is composed of a main body part 1A2 in the shape of a plate of a uniform thickness and a mount member 1A3 that is a bulge part provided on the main body part 1A2, and is mounted on a wiring board 4. The main body part 1A2 is, for example, a member in a substantially circular shape in a plan view having a predetermined thickness and has a lamination structure of a wiring layer S1, an insulating layer S2, and a thermal conduction layer S3 stacked in this order from the apical surface. The wiring layer S1 is a thin copper foil with a few μm thick on which gold (sliver) plating is processed and substantially including a pair of positive/negative wiring patterns S1(1), S1(2), each pattern of which is connected to a P layer or N layer of the LED 11. The insulating layer S2 is a thin layer a few tens μm thick whose material is a polyamide resin, an epoxy resin, or the like as a material. The thermal conduction layer S3 is made of aluminum as a material, whose thickness is sufficiently thick compared to the wiring layer S1 and the insulating layer S2, and transfers heat discharged from the LED 11 to, for example, an unillustrated casing. Incidentally, a symbol S5 denotes a through hole penetrating the supporting body 1A in a thickness direction and allows the wiring patterns S1(1) and S1(2) to pass through the wiring board 4.

The mount member 1A3 is a member in the shape of a block, having conductivity and made of, for example, copper whose area in a plan view is larger than that of the LED 11, which is joined to the witting pattern S1(1) using a first joint material, for example, cream solder in the center of the main body part 1A2.

The LED 11 is, for example, of a surface-mount type termed a so-called power LED that allows a current of 200 mA or more to flow therein continuously and has a PN junction structure in which an extremely thin (a few tens μm) semiconductor layer of a one type (for example, an N layer) is provided on a semiconductor layer of other type (for example, P layer). Generally, the LED emits light in a boundary part KB of the P and the N layers and also generates heat in that part KB. Since this LED 11 has much power consumption and much heat generation compared with the usual LED, in order to conduct heat radiation efficiently, contrary to the usual LED, a face close to the boundary part KB, i.e., in the present embodiment, a bottom TM, is designed to be a junction plane, which is joined closely to the apical surface center of the mount member 1A3 using gold-tin alloy that is a second bonding agent with less surface tension, different from the first binder. Incidentally, a symbol 27 denotes a hemispherical cover of transparent solid resin attached in order to protect the LED 11.

Figure 2:
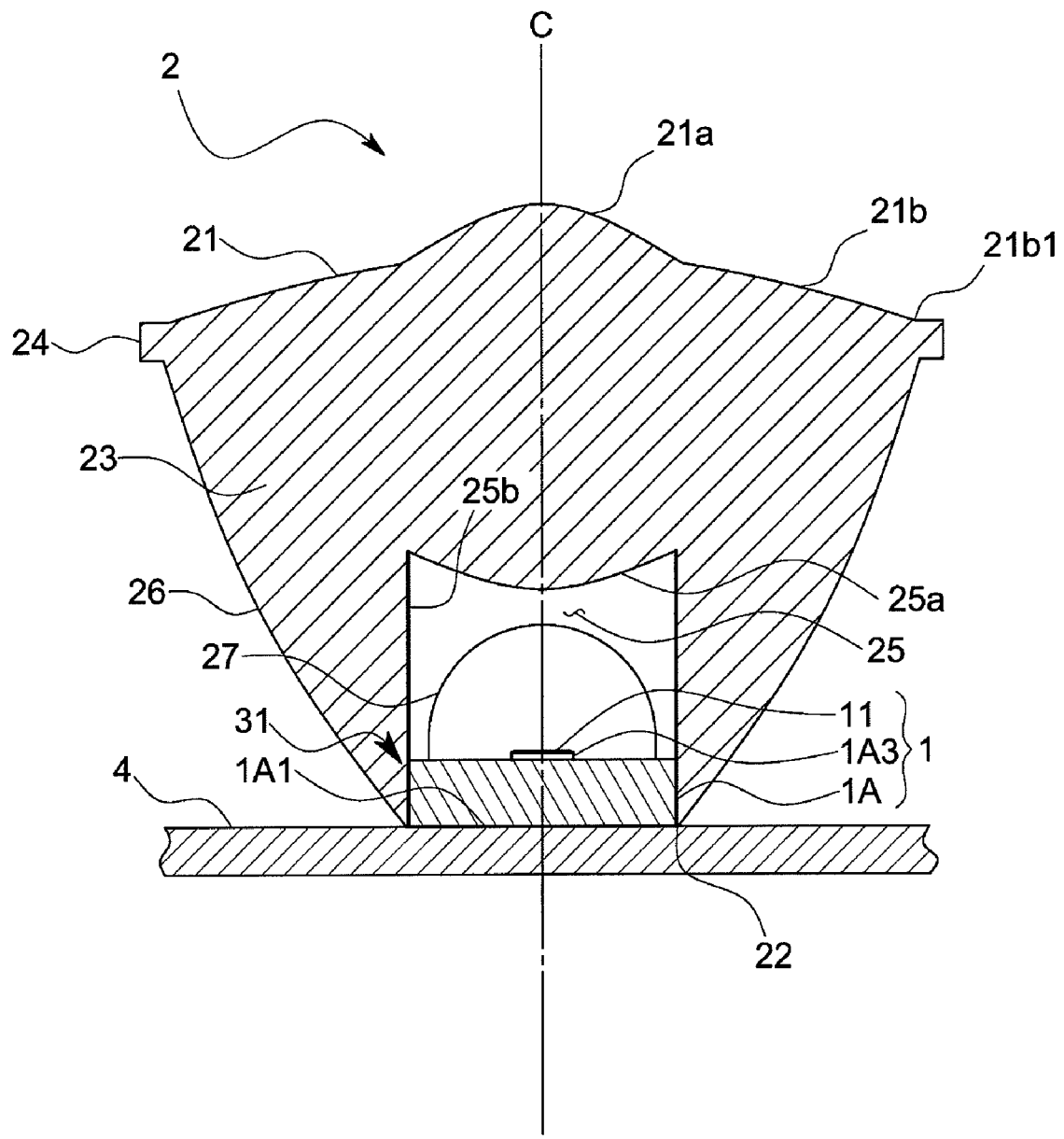
FIG. 2 is a central longitudinal sectional view showing mainly an internal structure of the optical unit in the embodiment.

The optical unit 2 has a solid transparent body 23 in the shape of a rotating body whose cross section is gradually widened as approaching an apical surface 21 from its base end face 22 and a brim part 24 provided being integral with an outer circumference of the apical surface 21 of the body 23 as shown in FIG. 2.

The body 23 has a recess 25 (hereinafter referred to as a base end recess) for housing the LED 11 opened on its base end face 22. A cross section of this base end recess 25 is a circular shape and has substantially the same size as the outer diameter of the supporting body 1A (more specifically, its main body 1A1). Further, this bottom 25a is protruded toward a base end face 22 side to form a convex lens shape. On the other hand, in the apical surface 21 of this body 23, a central convex lens part 21a is formed by protruding its central part, and a ring convex lens part 21b of a curvature different from that of the central convex lens part 21a is formed on its periphery. The brim part 24 is provided in an outside 21b1 of this ring convex lens part 21b being continuous thereto. Moreover, in a side 23a of the body 23, a curvilinear bulge surface 26 that is a reflection plane formed so as to render a parabola in a cross-sectional contour from the base end face 22 to the brim part 24 is provided.

Figure 5:
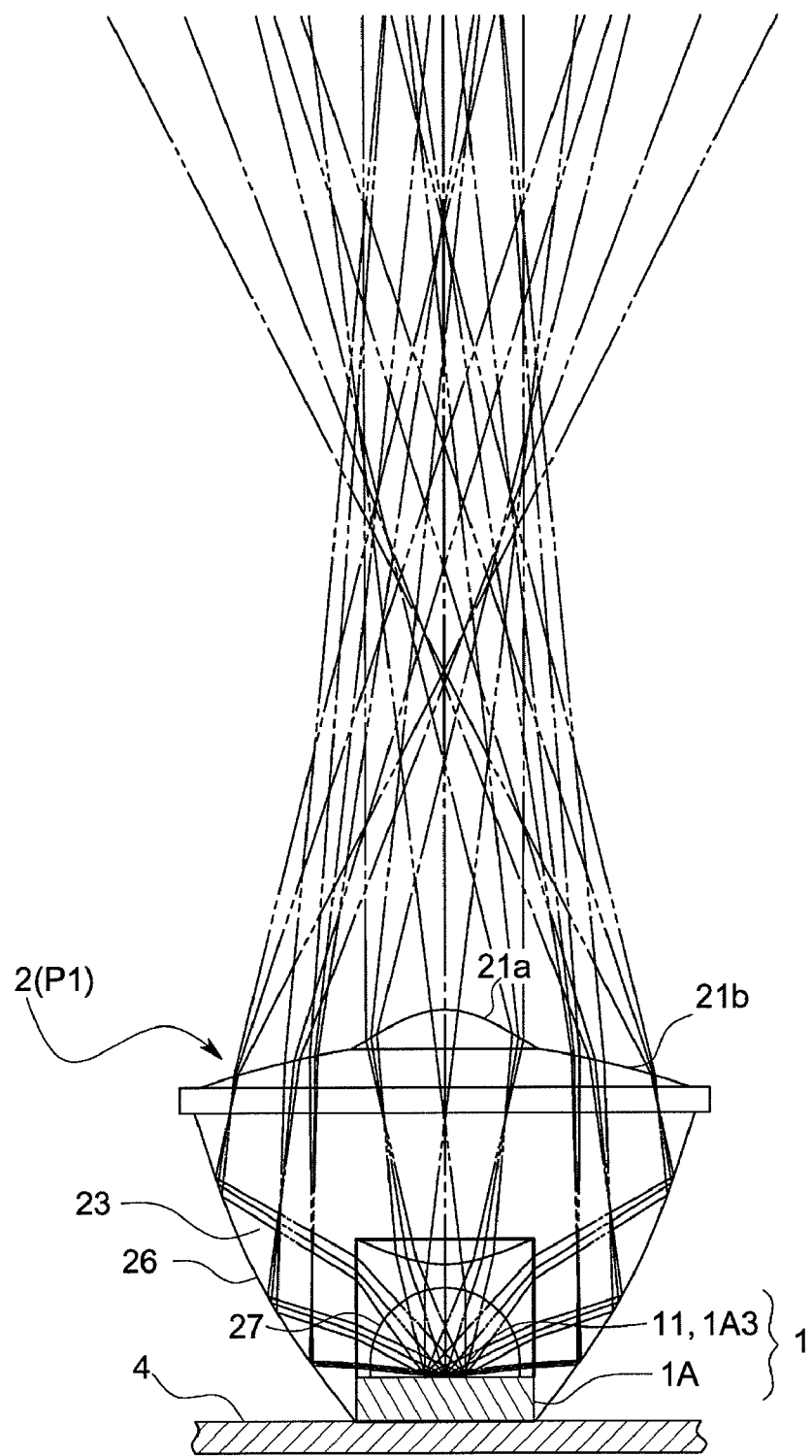
FIG. 5 is a diagram of light rays when the optical unit is placed at a proximity position in the embodiment.
Figure 7:
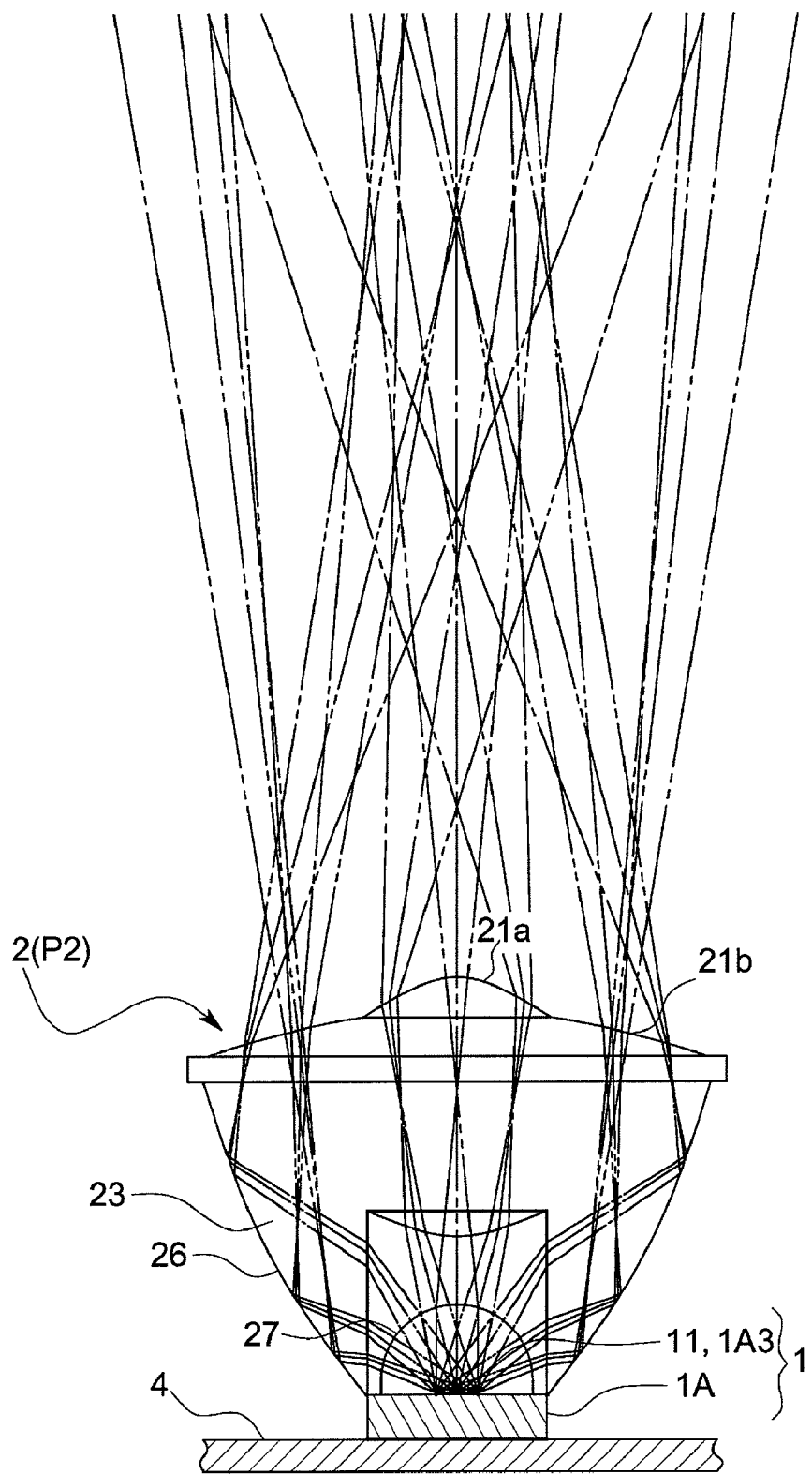
FIG. 7 is a diagram of light rays when the optical unit is placed at a clearance position in the embodiment.

Here, the LED actually has some area and performs surface emission. In the present embodiment, as shown in FIGS. 5 and 7 particularly, among the light rays coming out from the plane of the LED 11, substantially all the light rays passing through a side 25b of the recess 25 are configured to reach the curvilinear bulge surface 26, undergo total reflection there, and emit to the outside as mutually converging light rays toward an optical axis C through the ring convex lens part 21b. Moreover, on the other hand, among the light rays emitted from the LED 11, substantially all the light rays passing through the bottom 25a of the recess 25 are configured to emit to the outside as mutually converging light rays similarly toward the optical axis C through the central convex lens part 21a by a design.

Incidentally, although being a very small amount, there are such light rays that do not proceed the designed path, but proceeds a path different from what is described, for example, being reflected by the curvilinear bulge surface 26, passing through the central convex lens part 21a, and propagating along a path that is widening outwardly.

However, the present embodiment is further provided with a position adjustment mechanism for adjusting a relative position of the optical unit 2 to the LED 11 along an optical axis C direction.

This position adjustment mechanism is for making the optical unit 2 move with respect to the LED 11 between a proximity position P1 at which the whole of the supporting body 1A is housed in its base end recess 25 (shown in FIG. 5) and a clearance position P2 (shown in FIG. 7) where substantially whole of the supporting body 1A comes out of the base end recess 25, and the apical surface 1A1 of the supporting body 1A and the base end face 22 of the optical unit 2 become substantially the same height.

Specifically, this position adjustment mechanism has the position determination unit 31 for bringing the central axis C of the optical unit 2 into coincidence with the optical aids C of the LED 11 and an advancing/retreating unit for making the optical unit 2 advance or retreat along the optical axis C direction while keeping the position determination state. The position determination unit 31 is formed by fitting between an outer circumference of the supporting body 1A (more correctly, the main body part 1A2) and an inner circumference of the base end recess 25 substantially without looseness, and does not inhibit movement of the optical unit 2 in an optical axis C direction. Although not shown in the figure, an advancing retreating unit makes the optical unit 2 move in a range between the proximity position P1 and the clearance position P2 by an operation force from the outside, being formed between the casing and the optical unit 2.

Figure 6:
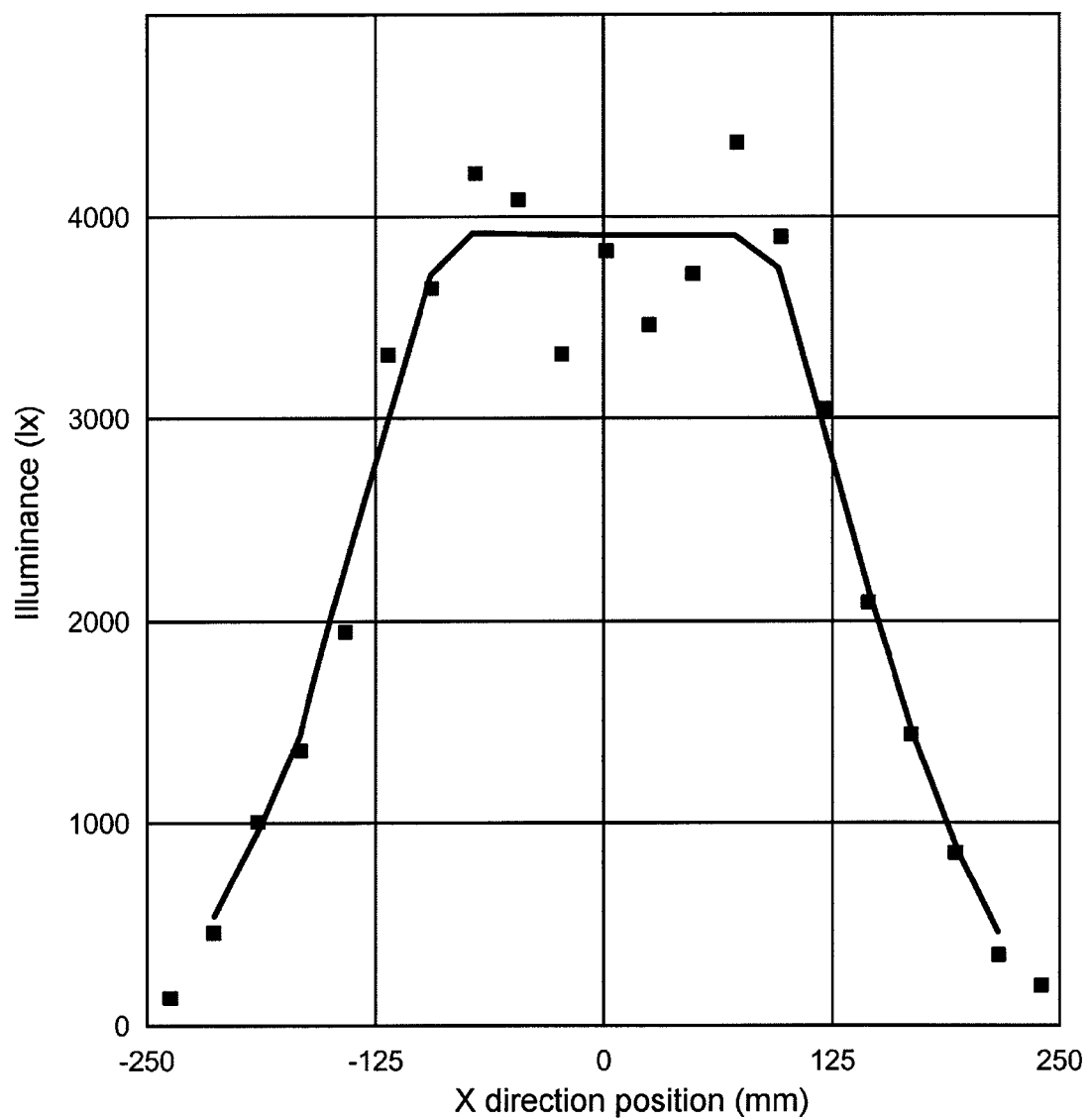
FIG. 6 is an illuminance distribution diagram when the optical unit is placed at the proximity position in the embodiment.
Figure 8:
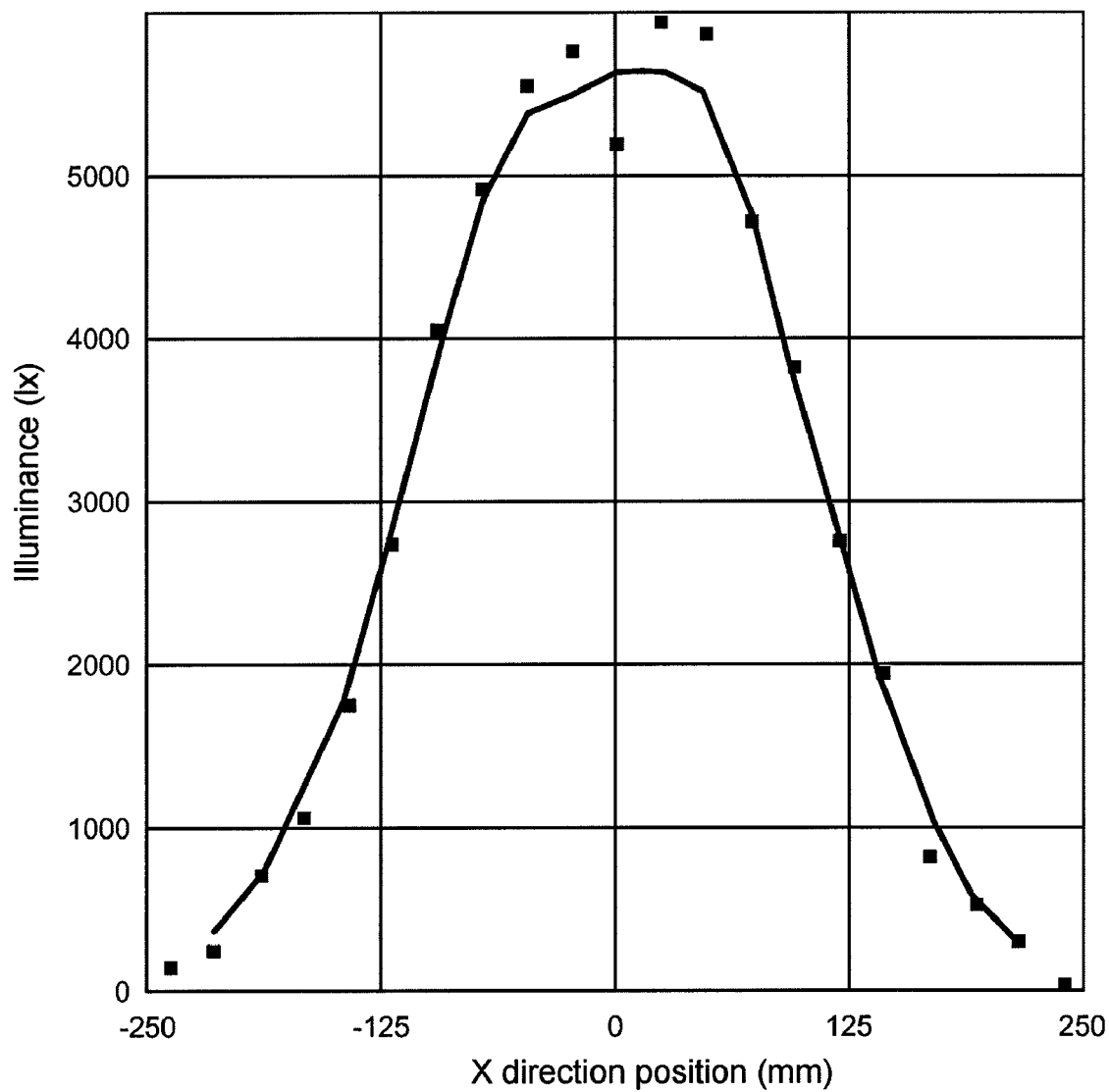
FIG. 8 is an illuminance distribution diagram when the optical unit is placed at the clearance position in the embodiment.

In such a configuration, when the optical unit 2 is placed at the proximity position P1, on a plane M1 that is set away from the LED 11 by a predetermined distance, the area of the light irradiation area becomes larger and the illuminance per unit area becomes lower (more correctly, an area of constant illuminance or more becomes larger) as shown in FIGS. 5 and 6; and when the optical unit 2 is placed at the clearance position P2, on the plane M1 that is set away from the LED 11 by a predetermined distance, the area of the light irradiation area becomes smaller and the illuminance per unit area becomes higher (more correctly, an area of constant illuminance or more becomes smaller) as shown in FIGS. 7 and 8.

Therefore, according to the present embodiment, the apparatus becomes very suitable for spot light illumination for product inspection where the widening/narrowing of the light irradiation area is required, and becomes suitable also for plant cultivation where an irradiation object grows and varies its size.

Moreover, in any case, since the LED 11 is always in the base end recess 25, and the curvilinear bulge surface 26 is placed on its side, substantially all the light rays emitted from the LED 11 (substantially all the light rays emitted in a range of ±90° with respect to the optical axis C) will pass though the ring convex lens part 21b or the central convex lens part 21a, and will be emitted forward, and consequently the efficiency can be improved largely. In addition, the optical unit 2 may be fixed and the LED 11 may be allowed to be moved.

Second Embodiment

Hereafter, a second embodiment will be described referring to the drawings. Incidentally, members that correspond to the members in the first embodiment are denoted by the same symbols, respectively.

Figure 9:
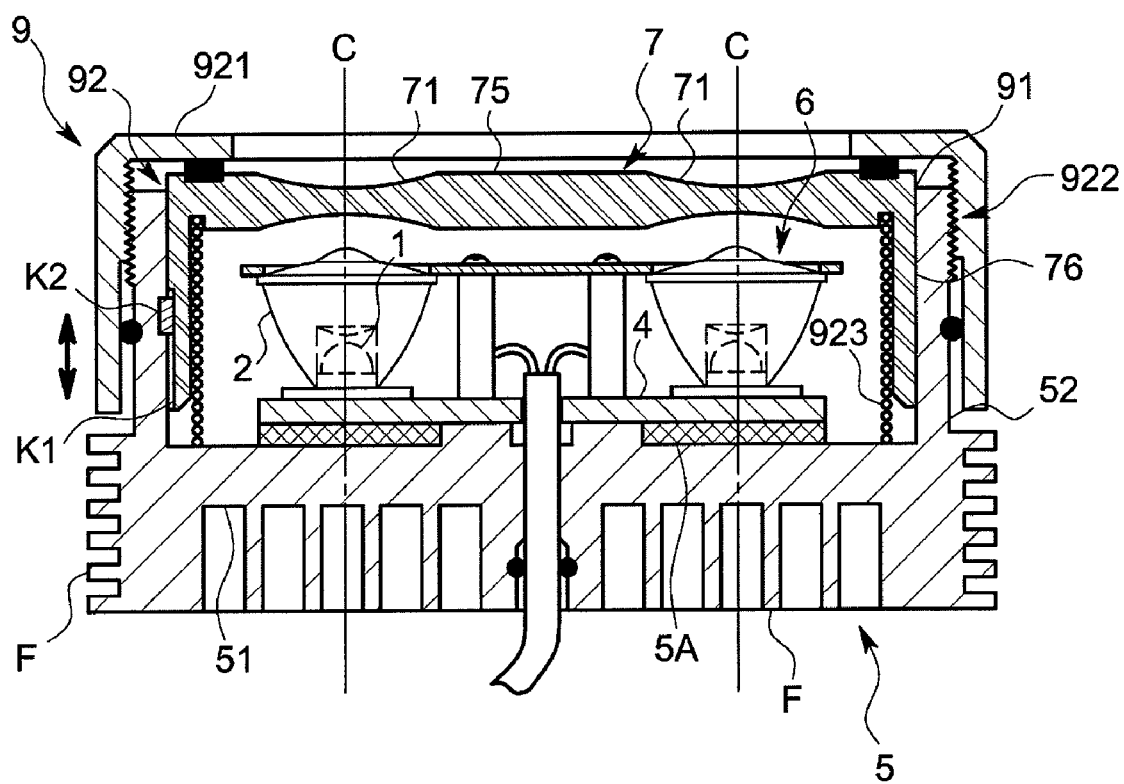
FIG. 9 is a central longitudinal sectional view showing a light irradiation apparatus in a second embodiment of the present invention.
Figure 10:
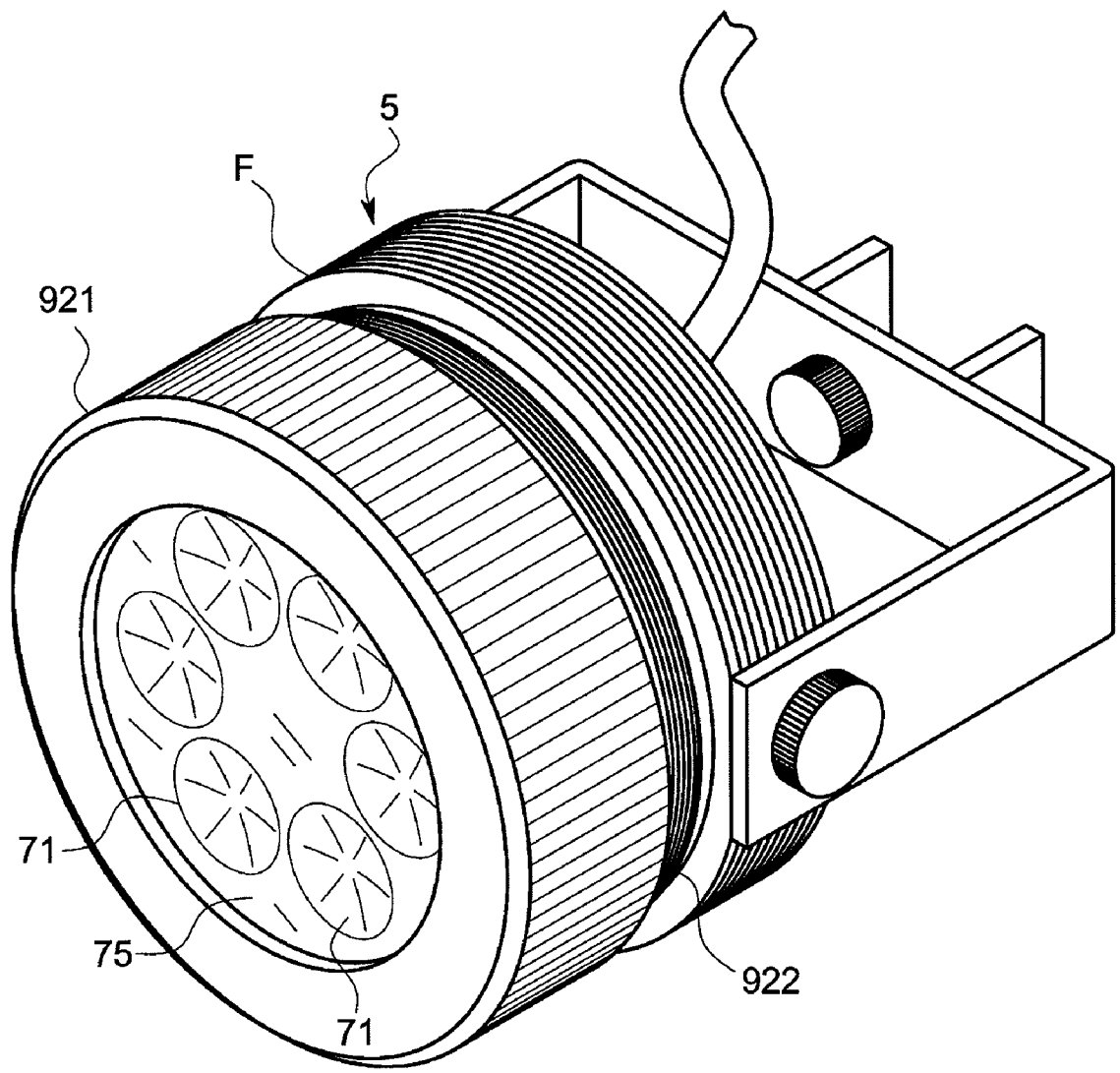
FIG. 10 is a perspective view showing the light irradiation apparatus in the embodiment.

As shown in FIGS. 9 and 10, the light irradiation apparatus according to the present embodiment has a substrate 5, a plurality of light irradiation blocks 6 and the same number of concave lenses 71 as the light irradiation blocks 6 that are supported by the substrate 5, and a position adjustment mechanism 9 for setting a distance between the light irradiation block 6 and the concave lens 71.

The substrate 5 is a metallic member in roughly a cylinder shape one of whose end faces is blocked with a thick bottom plate 51, and radiation-fin F is provided in the bottom plate 51 integrally.

The light irradiation block 6 has the LED package 1 and the optical unit 2 fixed to the LED package 1, and a plurality of light irradiation blocks 6 are attached to the wiring board 4 on a circle at equal intervals. Since these LED package 1 and optical unit 2 are the same as those of the first embodiment, their explanations are omitted. Moreover, an attachment mode of the optical unit 2 to the LED package 1 is the same as a case (shown in FIG. 5) at the proximity position P1 in the above-mentioned embodiment, and its emission path of the light is also the same. On the other hand, the wiring board 4 is a member in a circular shape, and is supported on the bottom plate 51 of the substrate 5 though heat conduction members 5A etc. Incidentally, the heat conduction member 5A is provided right under the each light irradiation block 6.

The concave lens 71 is disposed on the light irradiation side of the light irradiation block 6 with a clearance, and a plurality of the concave lenses (the same number of the concave lenses as the optical units 2) are formed in a single lens support 7 integrally. This lens support 7 substantially includes a disc-like plate member 75 on which a plurality of concave lenses 71 are formed on a circle at equal intervals integrally and a side wall member 76 that stands vertically from a flange part of the plate member 75.

The position adjustment mechanism 9 is for uniformly altering a position of the lens support 7, namely, the relative clearance between the concave lens 71 and the optical unit 2 along the optical axis C direction, and substantially includes a sliding mechanism 91 for supporting the lens support 7 (the concave lens 71) in a parallel movable manner along the optical axis C direction and a fixing mechanism 92 for fixing the lens support 7 (the concave lens 71) that is moved by the sliding mechanism 91 at a desired position.

The sliding mechanism 91 is for making the side wall member 76 making up the lens support 7 fit an inner circumferential surface of a side circumferential wall 52 of the substrate 5 without looseness in a slidable manner, and supporting the lens support 7 in a forward/backward movable manner along the optical axis C direction in a state where the lens support 7 is made to be parallel to the wiring board 4 and their central axes are brought into coincidence. Incidentally, symbols K1 and K2 denote a keyway and a key for inhibiting rotation of the lens support 7 and making the each concave lens 71 move slidingly while the optical axis thereof and the optical axis of respectively corresponding light irradiation block 6 are brought into coincidence.

The fixing mechanism 92 has: an elastic body (helical spring) 923 that is provided between the lens support 7 and the substrate 5 and applies an elastic force to the lens support 7 toward the light emission direction side; a cylindrical engagement member 921 that has an inward brim and holds the lens support 7 by engaging with the flange part of the lens support 7 and sandwiching it between itself and the elastic body 923; and a screw-thread feed mechanism 922 for moving this engagement member 921 forwardly/backwardly along the optical axis C direction. The screw-thread feed mechanism 922 includes screw parts provided on the inner circumference of the engagement member 921 and on the substrate side circumferential wall 52, respectively, being screwed together and can alter its height by the engagement member 921 being rotated forwardly/backwardly, so that the lens support 7 can be fixed at a desired position. Incidentally, the elastic bodies (helical springs) 923 are installed at positions surrounding the outer side of the light irradiation block group, inside the substrate side circumferential wall 52.

A movable range of the lens support 7 by this position adjustment mechanism 9 is, as shown in FIG. 11(a) and FIG. 12(a), between a clearance position P4 (spot size maximum) that is a position at which a diameter of the light emitted from the optical unit 2 becomes minimum or a position slightly nearer the optical unit 2 than it and a proximity position P3 (spot size minimum) that is set further nearer the optical unit than the clearance position P4. In addition, FIGS. 11(b) and 12(b) show differences of the light irradiation areas in a further distant place in illustrations.

According to the light irradiation apparatus configured in this way, both widening/narrowing of the light irradiation area and efficient utilization of the light can be satisfied, and therefore it becomes an extremely suitable apparatus for product inspection, plant cultivation, etc. Moreover, since a plurality of LED packages 1 are arranged on a plane, the light can be irradiated on a wide range and its effect becomes remarkable especially when using it for plant cultivation, plant lighting, etc. Besides, the position adjustment mechanism 9 can uniformly alter the clearance between the each concave lens 71 and the each optical unit 2, and therefore convenience of an adjusting operation of the irradiation area is improved compared with adjustment on a one-by-one basis.

Third Embodiment

Hereafter, a third embodiment will be described referring to the drawings. Incidentally, members that correspond to the members in the first and second embodiments are denoted by the same symbols.

Figure 13:
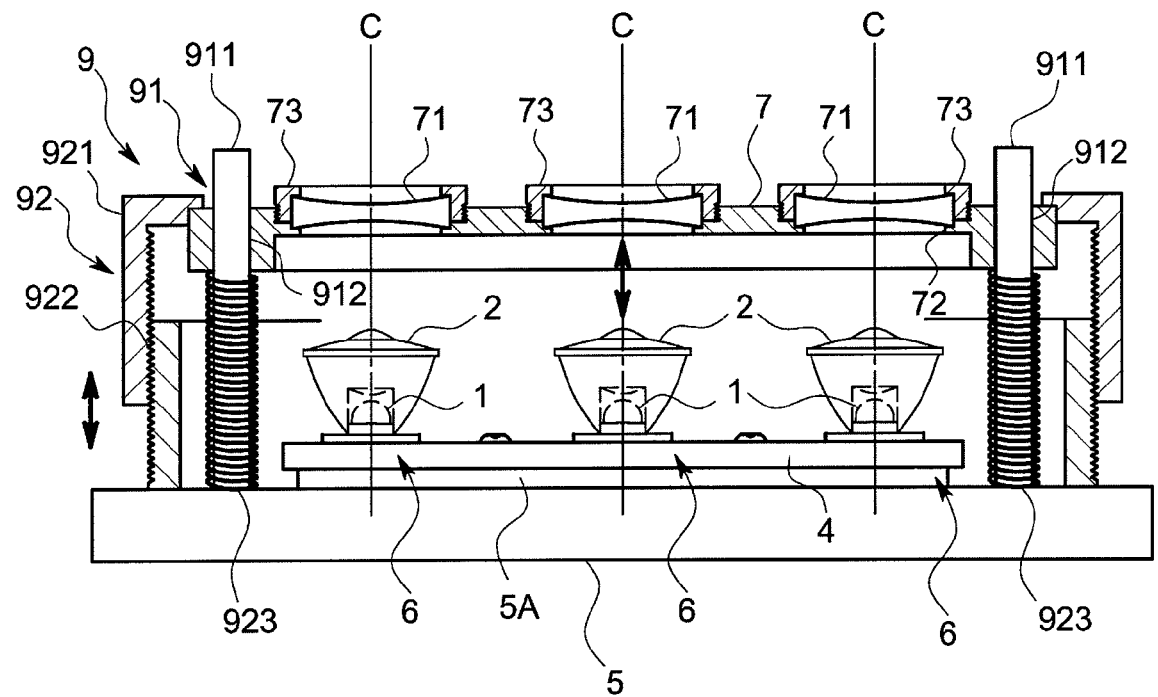
FIG. 13 is a central longitudinal sectional view showing a light irradiation apparatus in a third embodiment of the present invention.
Figure 14:
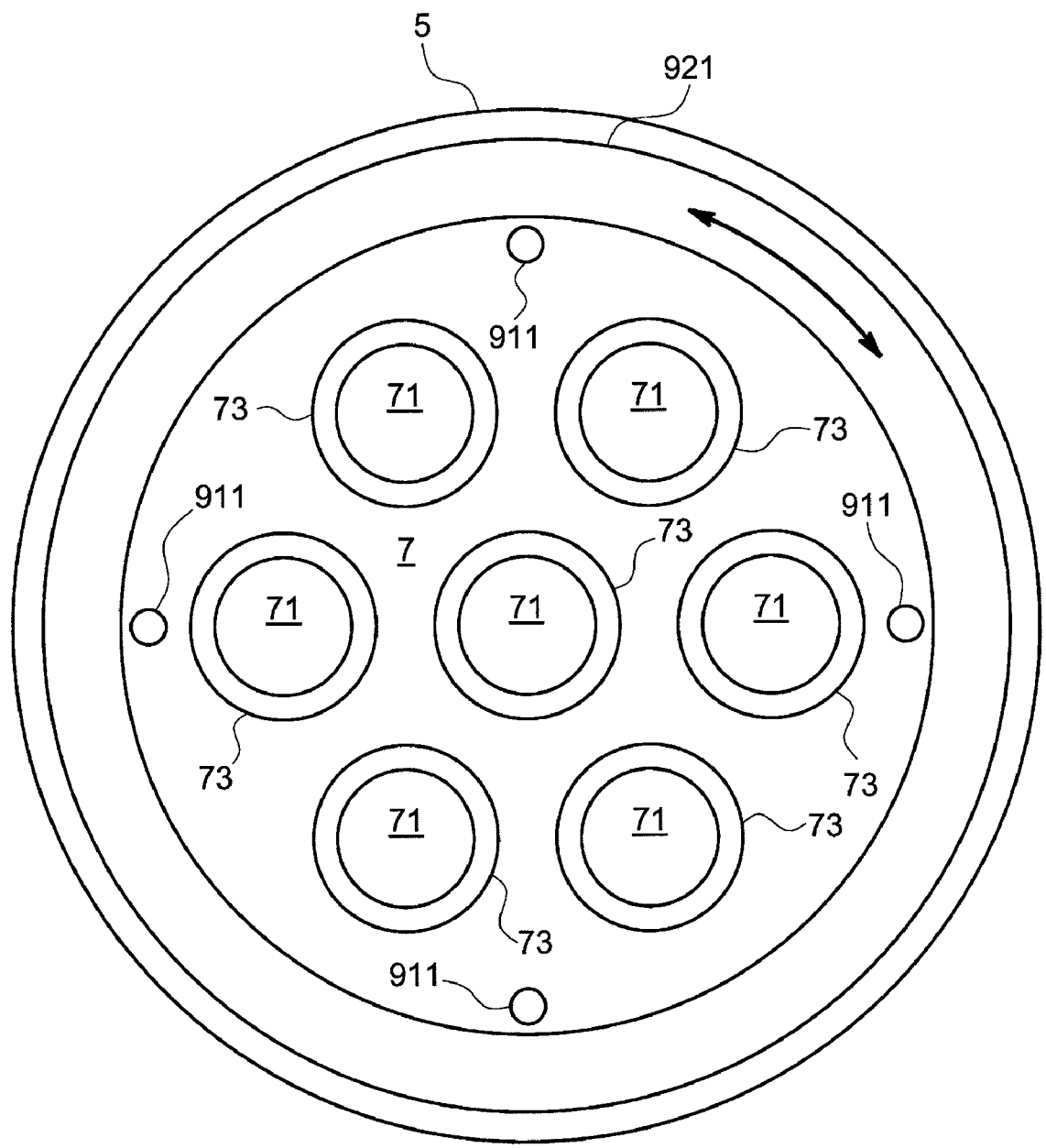
FIG. 14 is a plan view showing the light irradiation apparatus in the embodiment.
Figure 15:
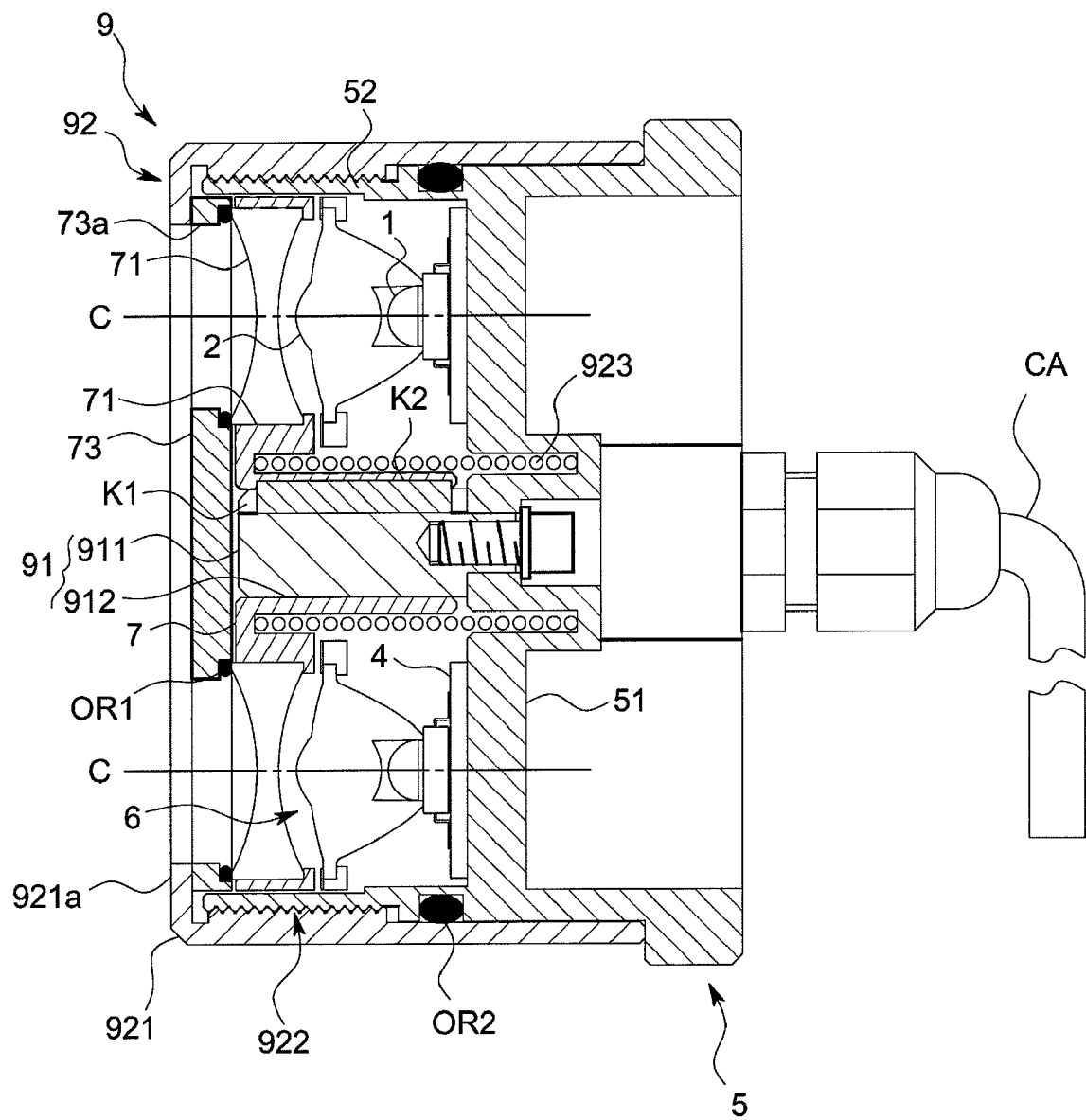
FIG. 15 is a central longitudinal sectional view showing a light irradiation apparatus in a fourth embodiment of the present invention.
Figure 16:
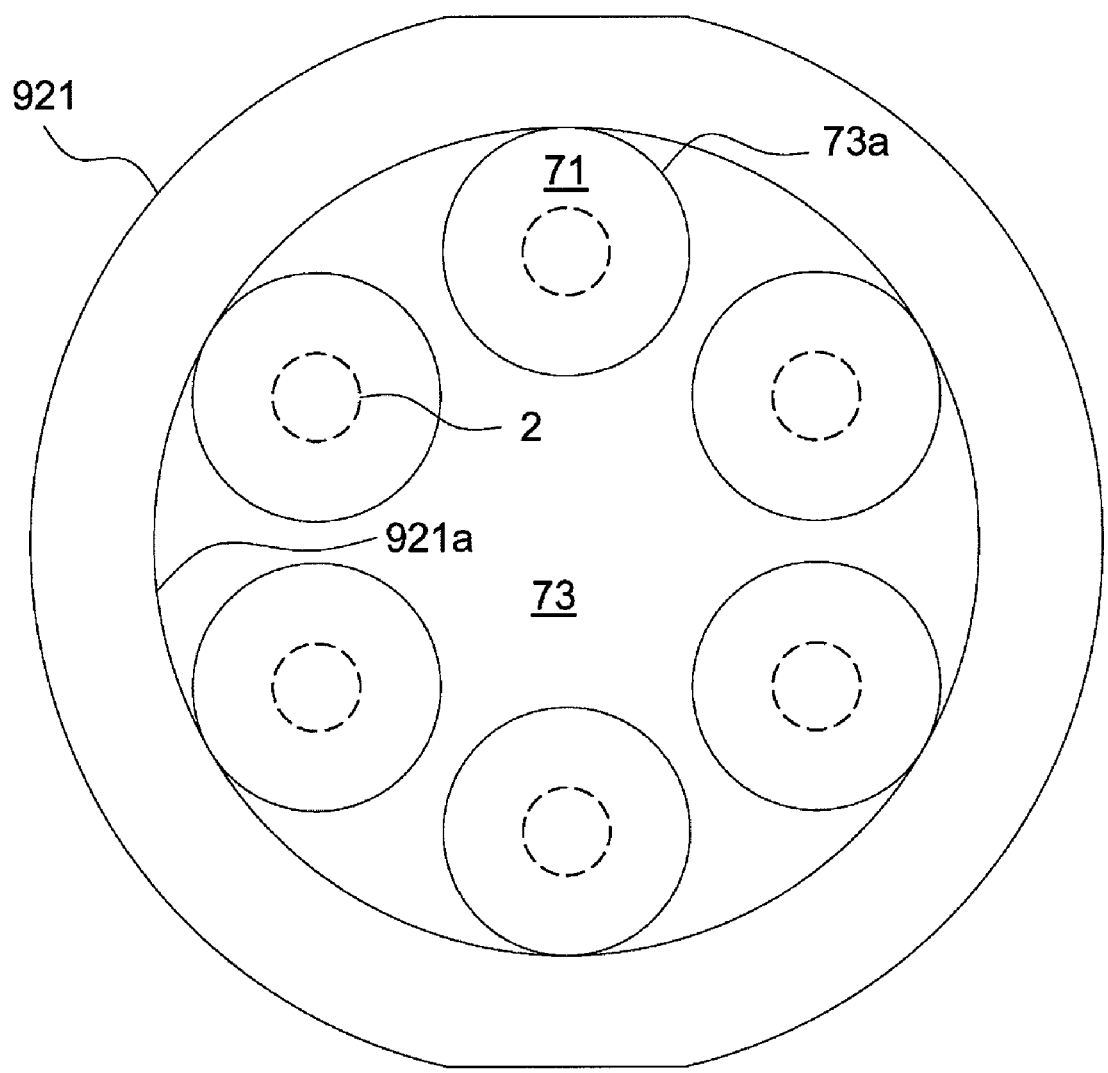
FIG. 16 is a plane view showing the light irradiation apparatus in the embodiment.
Figure 17:
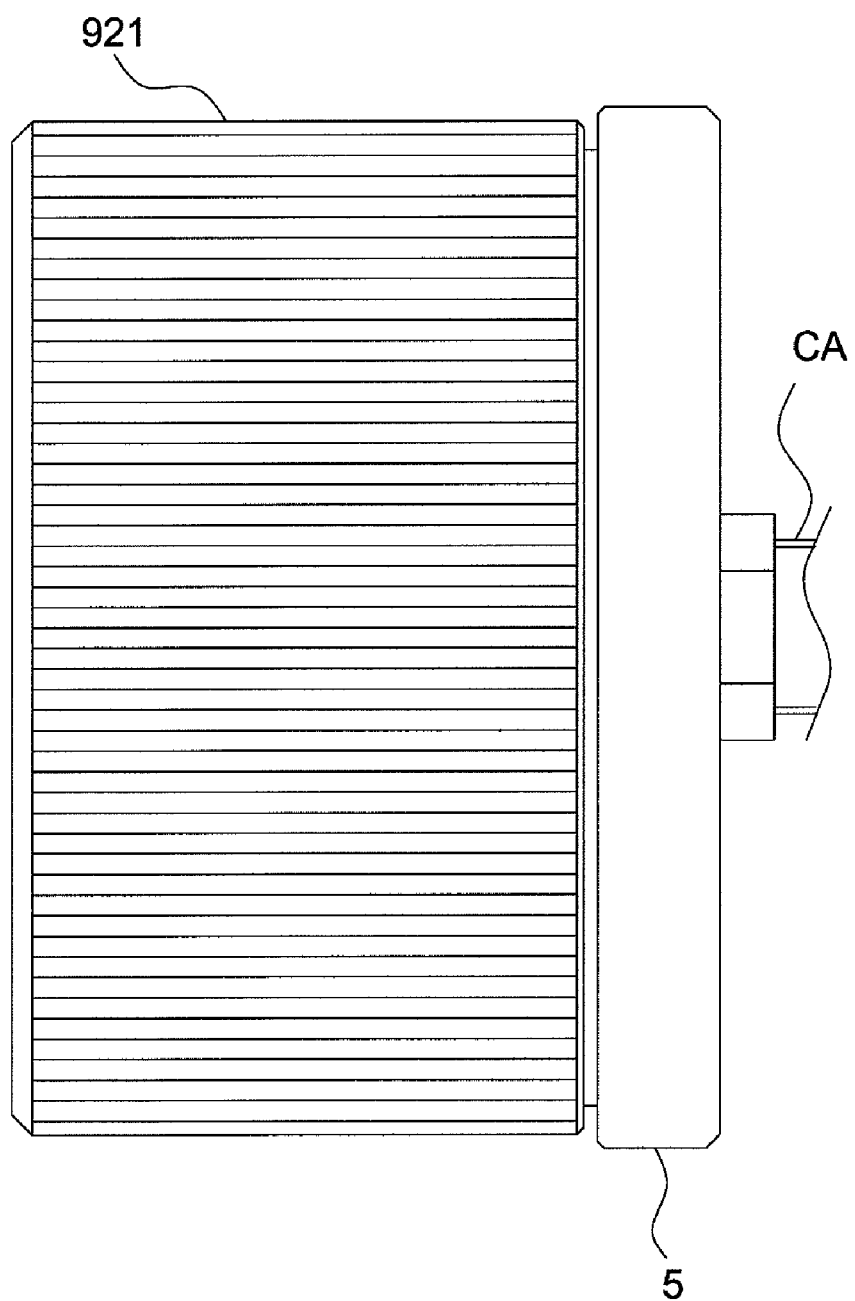
FIG. 17 is a side view showing the light irradiation apparatus in the embodiment.
Figure 18:
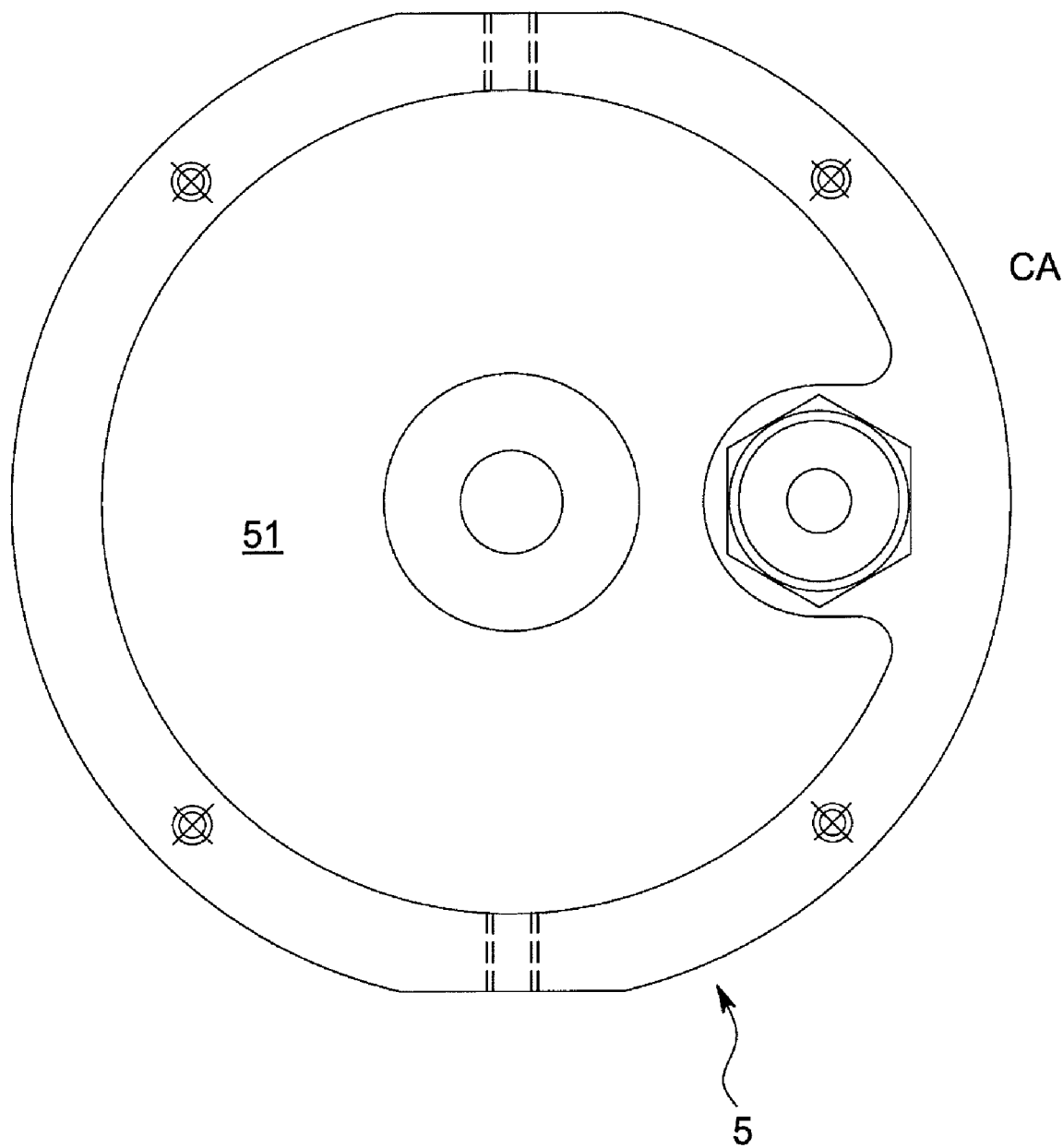
FIG. 18 is a bottom view showing the light irradiation apparatus in the embodiment.

A light irradiation apparatus according to the present embodiment has the substrate 5, a plurality of light irradiation blocks 6 and the same number of concave lenses 71 as the light irradiation blocks 6 that are supported by the substrate 5, and the position adjustment mechanism 9 for setting a distance between the light irradiation block 6 and the concave lens 71, as shown in FIGS. 13 and 14.

The substrate 5 is, for example, a metallic member in the shape of a disc having thermal conductivity and heat dissipation.

The light irradiation block 6 has the LED package 1 and the optical unit 2 fixed to the LED package 1. The plurality of light irradiation blocks 6 are fixed to the wiring board 4 on a circle thereof at equal intervals. Since these LED package 1 and optical unit 2 are the same as those of the first embodiment, their explanations are omitted. Moreover, an attachment mode of the optical unit 2 to the LED package 1 is the same as the case (shown in FIG. 5) at the proximity position P1 in the previous embodiment, and the emission path of the light is also the same. On the other hand, the wiring board 4 takes a form in the shape of a disc, which is held on the bottom plate 51 of the substrate 5 through the heat conduction member 5A etc.

The concave lens 71 is disposed on a light irradiation side of the light irradiation block 6, setting some distance. A plurality of concave lenses 71 (the same number of the concave lenses 71 as the optical units 2) are held by the lens support 7 in the shape of, for example, a disc that is supported by a plurality (for example, four) of struts 911 that are arranged in a standing condition parallel to the optical axis C direction from the substrate 5.

The lens support 7 has a plurality of lens fitting holes 72 (here, six are provided radially at equal distances) penetrated in a plurality of locations, and the each concave lens 71 is inserted and supported in this lens fitting hole 72. In this example, a step is provided in the side of the lens fitting hole 72, and the concave lens 71 is fixed by one surface on the flange part being abutted against the step and by other surface on the flange part being pressed by a ring pressing member 73 that is attached to the lens support 7. The position of each lens fitting hole 72 is set so that the central axis thereof may be in agreement with the optical axis C of the each optical unit 2, respectively.

The position adjustment mechanism 9 is for uniformly altering a position of the lens support 7, namely a relative clearance between the concave lens 71 and the optical unit 2 along the optical axis C direction, and substantially includes the sliding mechanism 91 for supporting the lens support 7 (the concave lens 71) in a parallel movable manner along the optical axis C direction and the fixing mechanism 92 for fixing the lens support 7 (the concave lens 71) that is moved by the sliding mechanism 91 at a desired position.

The sliding mechanism 91 is such that the each strut 911 is inserted into a strut insertion hole 912 that is provided in the flange part of the lens support 7 and penetrates it in a thickness direction slidably, and supports the lens support 7 in a forwardly/backwardly movable manner along the optical axis C direction in a state where the lens support 7 is made to be parallel to the wiring board 4 and their central axes are brought into coincidence.

The fixing mechanism 92 has a ring engagement member 921 that engages with a flange part of the lens support 7 and the screw-thread feed mechanism 922 for making this engagement member 921 move forwardly/backwardly along the optical axis C direction, and can alter its height by rotating the engagement member 921 and fix the lens support 7 at a desired position. In the present embodiment, an elastic member 923 that applies a force toward the light irradiation direction to the lens support 7 is further provided, and is configured to sandwich the lens support 7 between the engagement member 921 and this elastic member 923 without looseness. The elastic member 923 is a helical spring that is fit onto the each strut 911, respectively.

Figure 11:
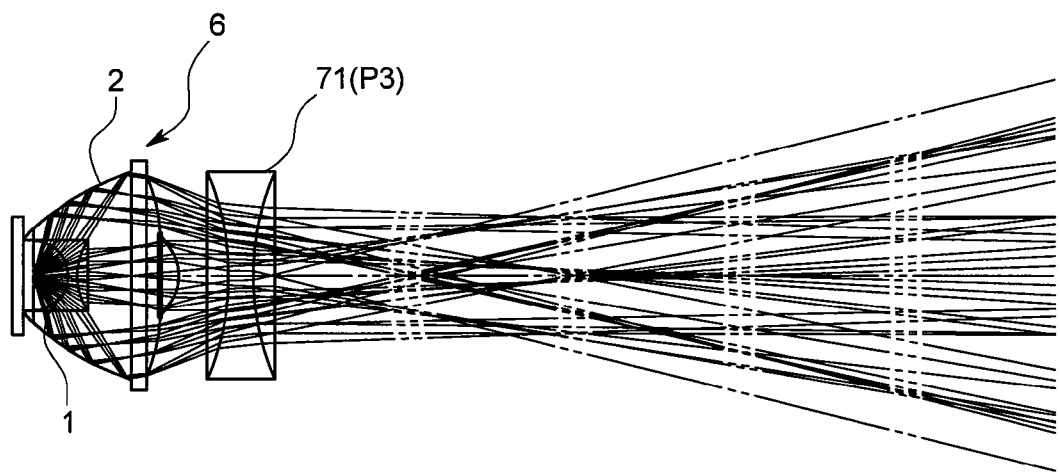
FIG. 11 is a diagram of light rays when a concave lens is placed at a clearance position.
Figure 11:
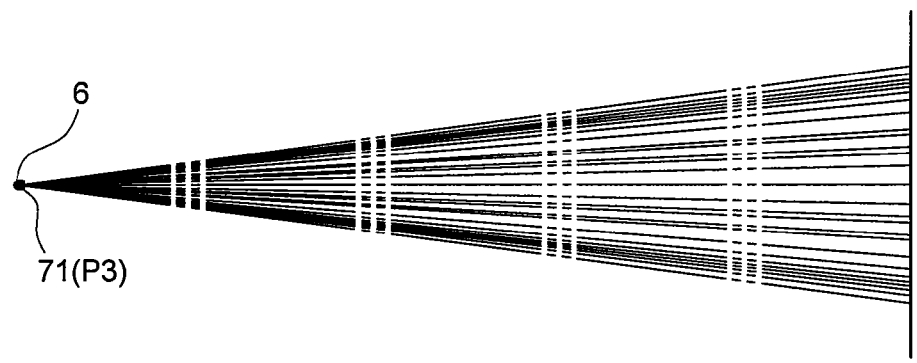
Figure 12:
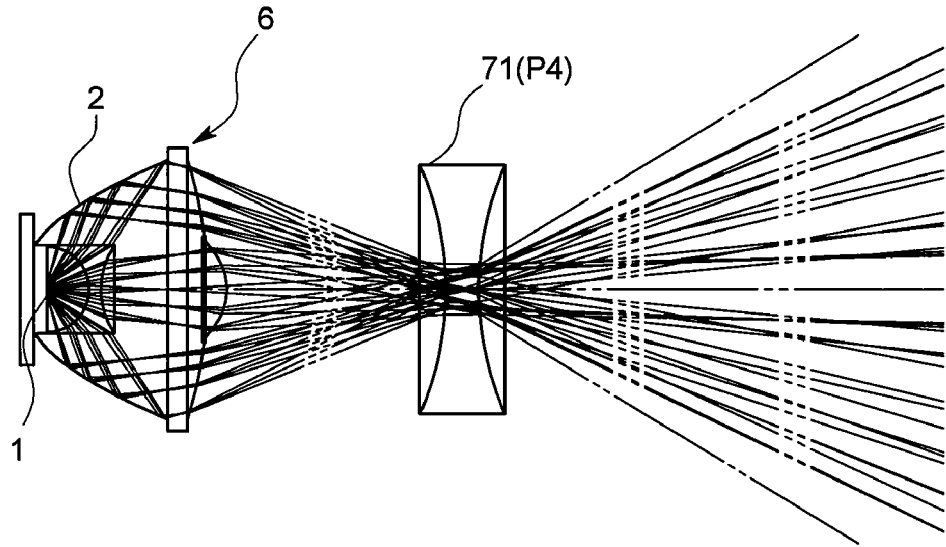
FIG. 12 is a diagram of light rays when the concave lens is placed at a proximity position.
Figure 12:
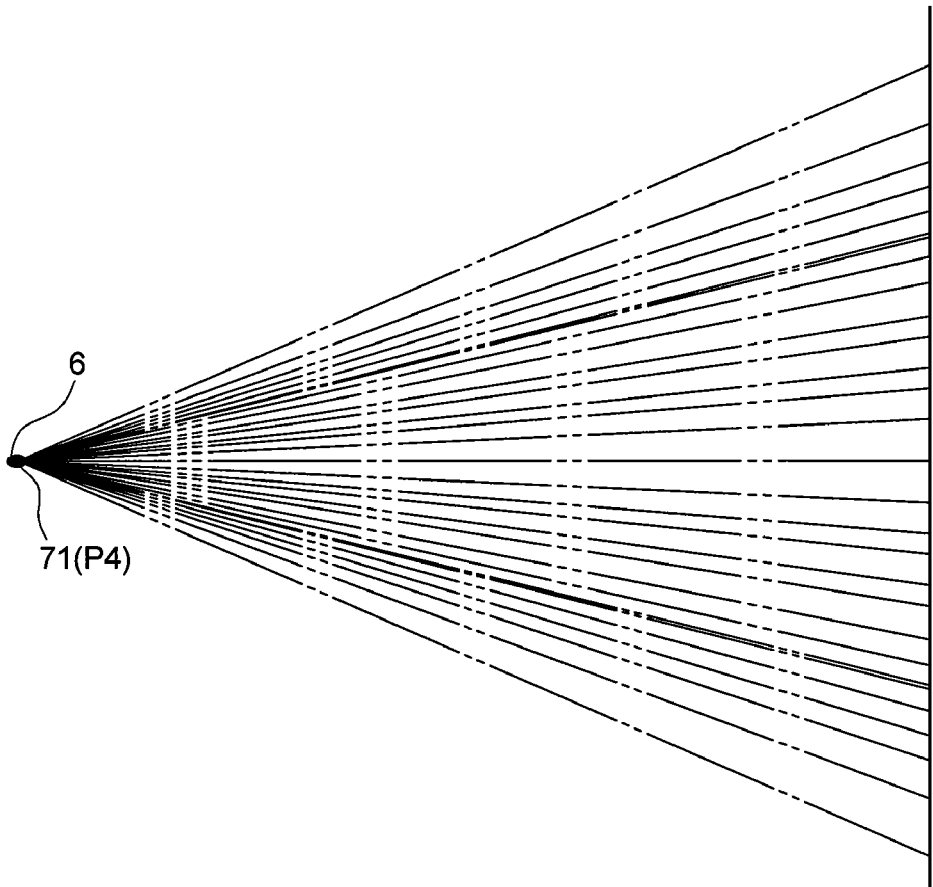

Since the movable range of the lens support 7 by this position adjustment mechanism 9 is the same as that of the second embodiment and its light ray diagram is the same as FIGS. 11 and 12, detailed explanation about this is omitted.

Fourth Embodiment

Hereafter, a fourth embodiment will be described referring to the drawings. Incidentally, members that correspond to the members in the first, second, and third embodiments are denoted by the same symbols.

A light irradiation apparatus according to the present embodiment has the substrate 5, a plurality of light irradiation blocks 6 and the same number of the concave lenses 71 as the light irradiation blocks 6 that are supported by the substrate 5, and the position adjustment mechanism 9 for setting a distance between the light irradiation block 6 and the concave lens 71, as shown in FIGS. 15 to 18.

The substrate 5 is a metallic member in the shape of roughly a sleeve one of whose end faces is blocked with a thick bottom plate 51. Although in the present embodiment, the bottom plate is not equipped with a radiator fin, a fin may be provided as necessary, like the second embodiment.

The light irradiation block 6 has the LED package 1 and the optical unit 2 that is fixed to the LED package 1, as the same with the second embodiment. A plurality of light irradiation blocks 6 are fixed to the wiring board 4 on a circle at equal intervals. Since structures, arrangement relation, etc. of this LED package 1, optical unit 2, and wiring board 4 are almost the same as those of the second embodiment, their explanations are omitted.

A plurality of concave lenses 71 are arranged on the light irradiation side being separated with a one-to-one correspondence with respective light irradiation blocks 6. These concave lenses 71 are held in the lens support 7.

This lens support 7 takes a form of roughly a disc, a plurality of lens fitting holes 72 are bored at a plurality of locations (here, six holes are provided radially at equal distances), and the concave lenses 71 are fitted in these lens fitting holes 72 and supported. A step is provided in the inner circumferential surface of the lens fitting hole 72 in this example, and the lens fitting hole 72 is so configured that the concave lens 71 fitted to the lens fitting hole 72 from an anti-irradiation direction does not escape to the other side by it being abutted to the step. Thus, the concave lens 71 fitted into the lens fitting hole 72 takes a form of a disc whose diameter substantially the same as that of the lens support 7, and its flange is pressed by a pressing member 73 in which a through hole 73a whose diameter is slightly smaller than the concave lens 71 with an intermediary of waterproofing means OR1, such as an O ring, whereby it is fixed.

The position adjustment mechanism 9 is for uniformly altering a position of the lens support 7, namely the relative clearance between the concave lens 71 and the optical unit 2 along the optical axis C direction, and substantially includes the sliding mechanism 91 that supports the lens support 7 (the concave lens 71) in such away that it can move in parallel along the optical axis C direction and the fixing mechanism 92 for fixing the lens support 7 that moves by the sliding mechanism (the concave lens 71) at a desired position.

A cylindrical member 911 protruded from the center of the substrate 5 is fitted with a sleeve body 912 that is protruded from the center of the lens support 7 to the substrate side integrally, from its outside, whereby the sliding mechanism 91 supports the lens support 7 in a forward/backward movable manner toward the optical axis C direction in a state where the lens support 7 is made to be parallel to the wiring board 4 and their central axes are brought into coincidence. Incidentally, symbols K1 and K2 denote a keyway and a key, respectively, for inhibiting rotation of the lens support 7 and making the each concave lens 71 move slidingly while the optical axis thereof and that of respectively corresponding light irradiation block 6 are brought into coincidence.

The fixing mechanism 92 has the elastic member (helical spring) 923 that is provided between the lens support 7 and the substrate 5 and applies an elastic force to the lens support 7 in a light emission direction, a cylindrical engagement member 921 having the inward brim 921a that engages with the flange part of the lens support 7 and sandwiches it between itself and the elastic member 923, thereby holding the lens support 7, the screw-thread feed mechanism 922 for moving this engagement member 921 forwardly/backwardly along the optical axis C direction. The screw-thread feed mechanism 922 is a mechanism in which screw parts provided on an inner circumference of the engagement member 921 and the substrate side circumferential wall 52, respectively, are screwed together, and can alter its height by the engagement member 921 being rotated normally/reciprocally and fix the lens support 7 at a desired position. The elastic member (helical spring) 923 is disposed in the center along the axis of the substrate 5. More specifically, it is disposed in the surrounding of the cylinder 911, being an inner side than the each light irradiation block 6. In addition, a waterproof member OR2, such as an O ring, is provided between the inner circumference of the engagement member 921 and an outer circumference of the substrate side circumferential wall 52, whereby an inner space for housing the light irradiation block 6 is so configured that water etc. may not invade from the outside in cooperation with the waterproof member OR1. In the present embodiment, a waterproof type is used also for a feed through of electric cable CA.

Since a movable range of the lens support 7 by this position adjustment mechanism 9 is the same as that of the second embodiment and its light ray diagram is the same as FIGS. 11 and 12, detailed explanations about them are omitted.

Note that the present invention is not restricted to the above-mentioned embodiments.

Figure 19:
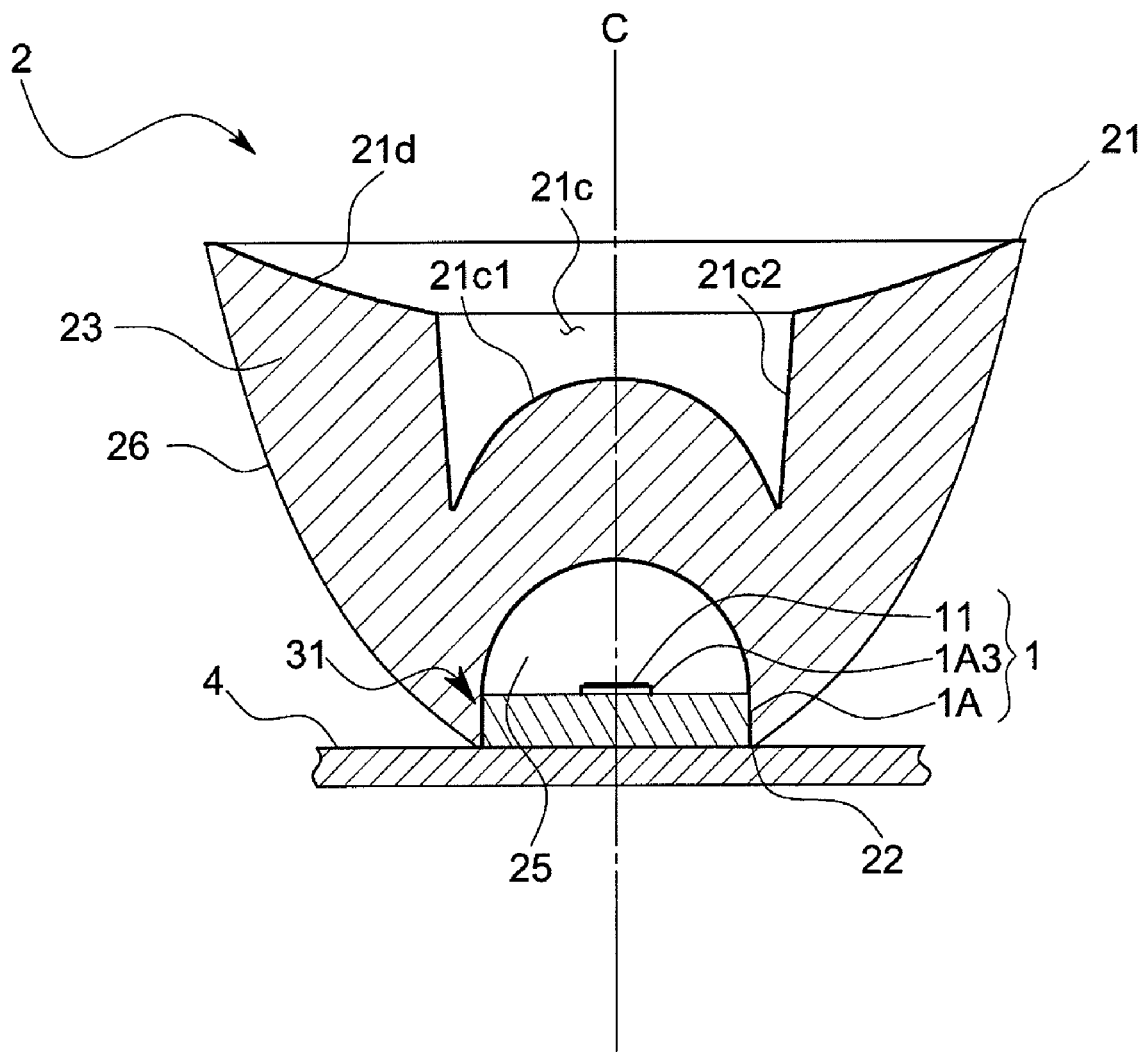
FIG. 19 is a central longitudinal sectional view showing an optical unit in a further another embodiment of the present invention.

First, the optical unit 2 may also be formed so as to have, as shown in FIG. 19, an apical recess 21c opened in the central part of the apical surface 21 of the body 23, and a ring concave lens part 21d whose depression becomes larger gradually as a position goes nearer the center formed in the periphery of the apical recess 21c. Among the light rays emitted from the LED 11, substantially all the light rays passing through the apical recess 21c are configured to emit to the outside as outwardly diverging light rays without allowing them to pass through the concave lens part 21d, while substantially all the light rays not passing through the apical recess 21c are configured to undergo total reflection on the curvilinear bulge surface 26, pass through the concave lens part 21*d*, and emit to the outside as outwardly diverging light rays.

Although this configuration specifies that the base end recess 25 has, for example, roughly a hemispherical shape, the shape may be as of the embodiment. Moreover, substantially the whole of the bottom 21*c*1 of the apical recess 21*c* is protruded toward the apical surface 21 side, so that it is made to function as a convex lens part, and a side 21*c*2 of this apical recess 21*c* is specified to be a taper plane that gradually widens as a point approaches the apical surface side.

Figure 20:
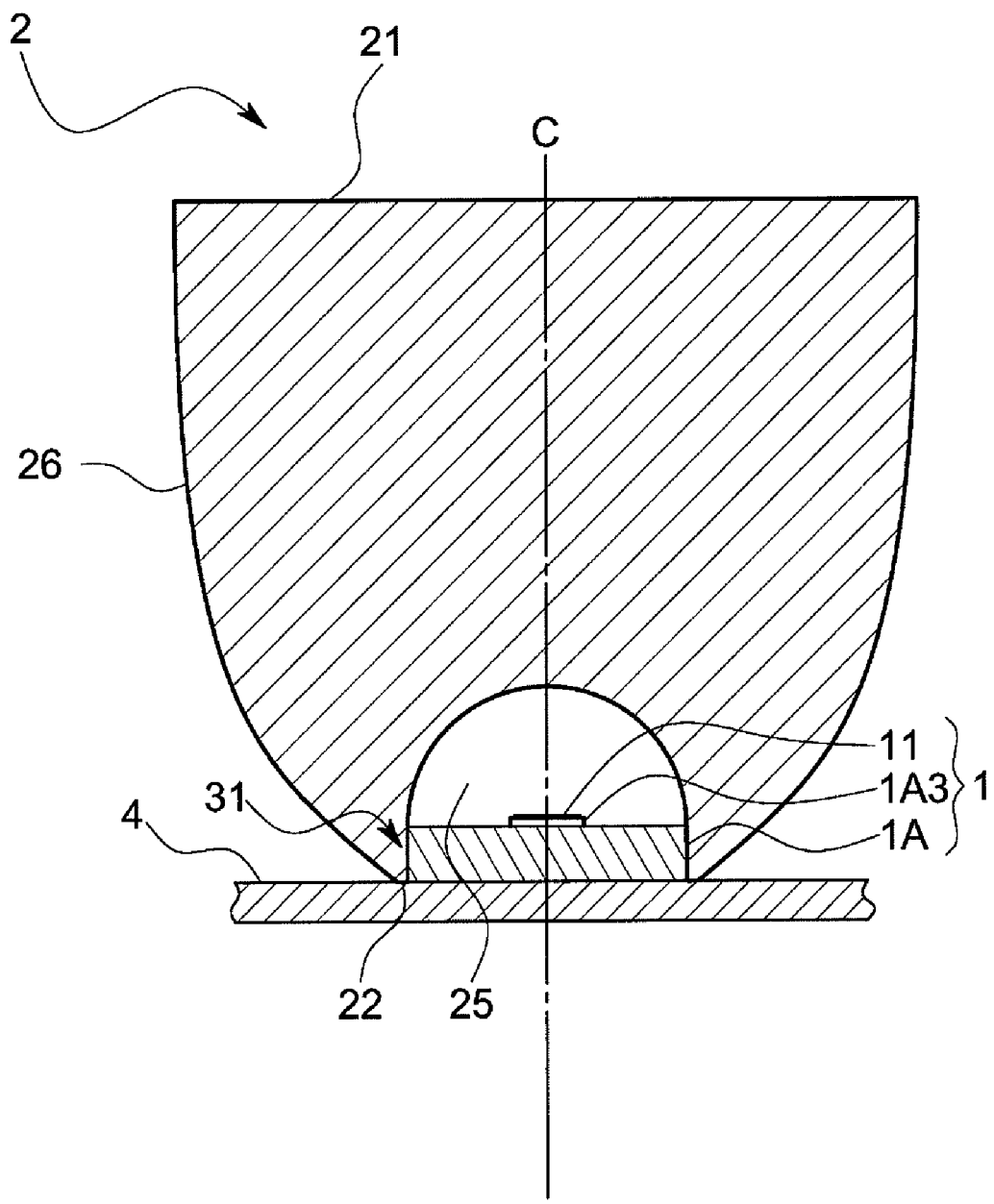
FIG. 20 is a central longitudinal sectional view showing an optical unit in a further other embodiment of the present invention.

Moreover, for example, as shown in FIG. 20, even when the optical unit 2 is made into a simple bowl type shape having the flat apical surface 21, the curvilinear bulge surface 26, and the base end face 22, and the base end recess 25 is made to form an opening on the base end face 22, the same effect as that of the embodiments can be attained.

Further, although not illustrated, the mount member that is a bulge part and the base end recess may fit each other.

Moreover, a Fresnel-lens structure may be adopted for the convex lens part 21*a*, and a mirror plane may be formed, for example, by evaporating a metal thin film etc. on the curvilinear bulge surface 26, whereby the light is reflected inwardly.

Figure 21:
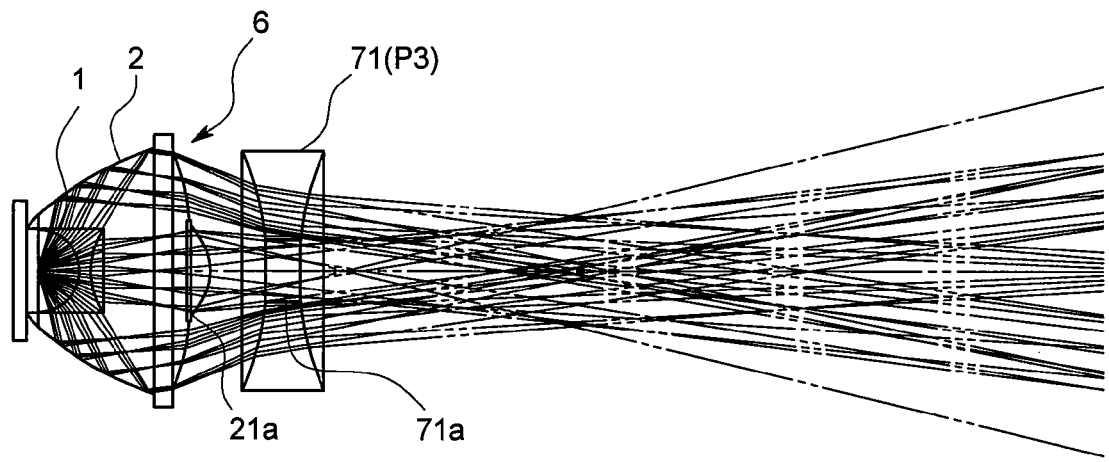
FIG. 21 shows a concave lens in a further other embodiment of the present invention and is a diagram of light rays when the concave lens is placed at a clearance position.
Figure 21:
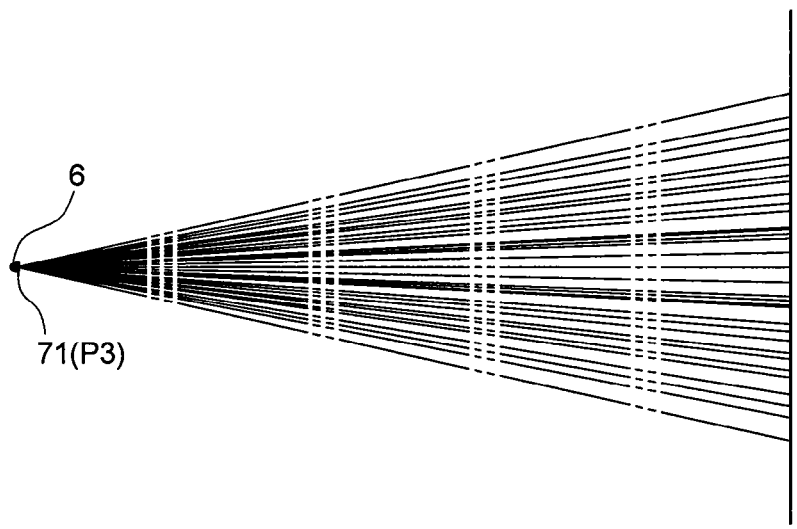
Figure 22:
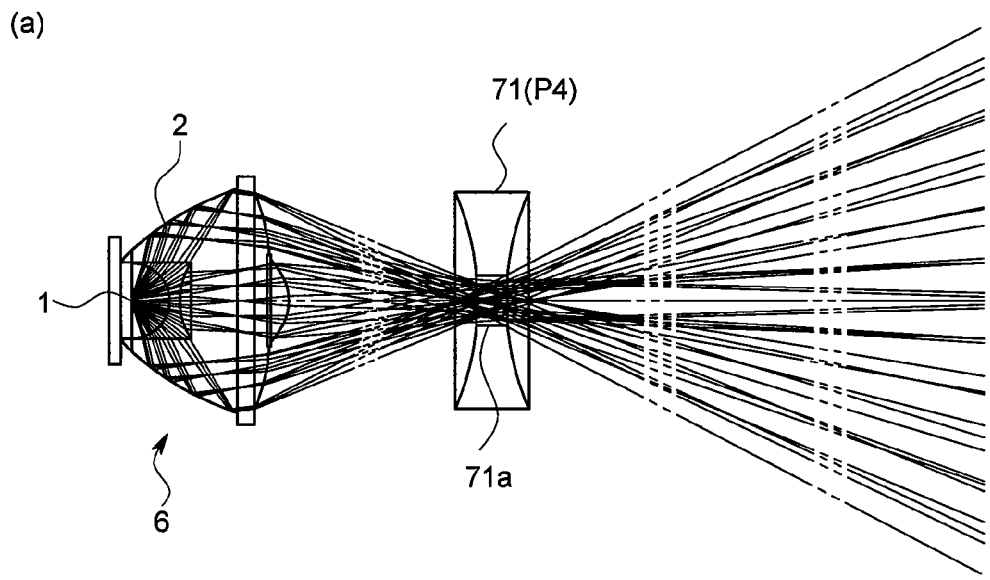
FIG. 22 is a diagram of light rays when the concave lens is placed at a proximity position in the same embodiment.
Figure 22:
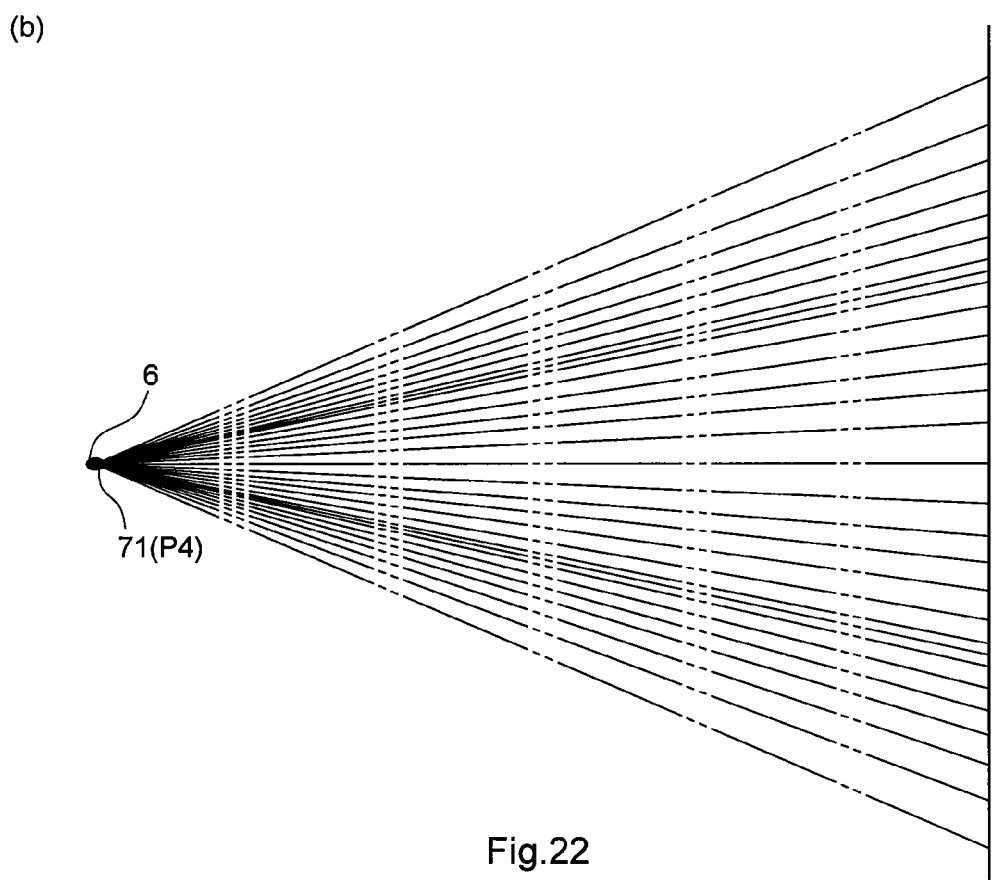

Next, the concave lens 71 that was applied in the second and third embodiments my be so configured that, as shown in FIGS. 21(*a*) and 22(*a*), a through hole 71*a* is provided in the center, and substantially all the light rays coming out from the optical unit are configured to pass through the through hole 71*a*.

At the clearance position P4, even if the through hole 71*a* is not formed, the light emitted from the optical unit 2 becomes roughly a minimum in diameter, and is focused in a range where the curvature near the center of the concave lens 71 is small and the refraction power becomes a minimum. The light rays make crossing from there while the light passes through the concave lens 71 being affected little by the refraction, and become most widened light. Therefore, the formation of the through hole 71*a* near the center of the concave lens 71 does not cause any particular nonconformity. Conversely, if the through hole 71*a* is formed, a particular effect that attenuation of the light at the clearance position P4 where, as described above, the light widens mostly and the illuminance becomes small can be controlled. Naturally, although an effect of inhibiting an attenuation of light is not obtainable, a uniform-thickness part may be provided instead of this through hole 71*a*. FIGS. 21(*b*) and 22(*b*) show differences of the light irradiation areas in further distant positions.

Moreover, the diameter of the through hole may be so configured that substantially all the light rays coming out from the central convex lens part may pass through the through hole over the whole range in which the concave lens can move. The light rays close to the optical axis that come out from the LED becomes effective in a case where a control by the central convex lens part of the optical unit is sufficient because of a relationship of the illuminance distribution desired in the light irradiation area.

In addition to this, the present invention may be carried out by appropriately combining the configurations described above including the embodiments, and various modifications may be possible without departing from the spirit and scope of the invention.

According to the present invention, the light irradiation apparatus that can adjust widening/narrowing of the light irradiation area and can guide almost all the light rays emitted from the LED to the light irradiation area without a loss can be provided.

What is claimed is:

1. A light irradiation apparatus, comprising:
an LED,
an optical unit with an optical transmission characteristic that makes light from the LED pass through the inside thereof and makes it emit from its apical surface, and
a supporting body having the LED installed on its apical surface, wherein
the optical unit is in a shape of a rotating body centered in an optical axis of the light emitted from the LED, and is so configured that a base end recess for housing the LED is opened in a central part of its base end face, and a reflection plane for performing substantially total reflection of the light from the LED is formed on its side, and is further equipped with a position adjustment mechanism for adjusting a relative position between the LED and the optical unit along an optical axis direction, wherein
the position adjustment mechanism makes the optical unit move relative to the LED between a proximity position at which a part or whole of the above mentioned supporting body is housed in a base end recess and a clearance position at which substantially the whole of the supporting body comes out of the base end recess and the apical surface of the supporting body and a base end face of the optical unit become substantially the same height, wherein
the optical unit is so configured that a central convex lens part formed on its apical surface central part, a ring convex lens part with a different curvature formed on an apical surface in the periphery of the central convex lens part, and a curvilinear bulge surface acting as a reflection plane formed on its side, and the optical unit is so configured that at least at the proximity position, among the light rays emitted from the LED, substantially all the light rays passing through the side of the base end recess undergo total reflection on the curvilinear bulge surface and output them as mutually converging light rays through the ring convex lens part, while substantially all the light rays passing through a bottom of the recess emit to the outside as mutually converging light rays through the central convex lens part.

2. The light irradiation apparatus according to claim 1, wherein
a convex lens part is formed on the bottom of the base end recess.

3. A light irradiation apparatus, comprising:
an LED,
an optical unit with an optical transmission characteristic that makes light from the LED pass through the inside thereof and makes it emit from its apical surface, and
a supporting body having the LED installed on its apical surface, wherein
the optical unit is in a shape of a rotating body centered in an optical axis of the light emitted from the LED, and is so configured that a base end recess for housing the LED is opened in a central part of its base end face, and a reflection plane for performing substantially total reflection of the light from the LED is formed on its side, and is further equipped with a position adjustment mechanism for adjusting a relative position between the LED and the optical unit along an optical axis direction, wherein
the position adjustment mechanism makes the optical unit move relative to the LED between a proximity position at which a part or whole of the above mentioned supporting body is housed in a base end recess and a clearance position at which substantially the whole of the supporting body comes out of the base end recess and the apical surface of the supporting body and a base end face of the optical unit become substantially the same height, wherein the optical unit is so configured that an apical recess is opened in the apical surface central part thereof, a ring concave lens part is formed in the periphery on the apical surface of the apical recess, and a curvilinear bulge surface acting as a reflection plane on its side, wherein, among light rays emitted from the LED, substantially all the light rays passing through the apical recess are configured to emit to the outside as outwardly diverging light rays without allowing them to pass through the concave lens part, while substantially all the light rays not passing through the apical recess are configured to undergo total reflection on the curvilinear bulge surface, pass through the concave lens part, and emit to the outside as outwardly diverging light rays.

4. The light irradiation apparatus according to claim 3, wherein a central convex part is formed in a bottom of the apical recess.

5. A light irradiation apparatus, comprising:

an LED, a solid optical unit with optical transparency that is in a shape of a widening-toward-end rotating body with a center of the optical axis of the light emitted from the LED, and makes the light from the LED pass through its inside and emit it from its apical surface; and a concave lens disposed in a further apical end of the optical unit; wherein the optical unit is so configured that a reflection plane for performing substantially total reflection of the light from the LED is formed on its side, and further comprising a position adjustment mechanism for setting a clearance between the concave lens and the optical unit along the optical axis direction to be variable, wherein the optical unit is so configured that a base end recess for housing the LED is opened in a central part of its base end face, a central convex lens part is formed in the central part on its apical surface and a ring convex lens part of a curvature different from that of the central convex lens part is formed in the periphery thereof, and a curvilinear bulge surface acting as a reflection plane for performing substantially total reflection of the light from the LED is formed on its side, wherein, among the light rays emitted from the LED, substantially all the light rays passing through the side of the base end recess are configured to undergo total reflection on the curvilinear bulge surface and emit to the outside as mutually converging light rays through the ring convex lens part, while substantially all the light rays passing through the bottom of the recess are configured to emit to the outside as mutually converging light rays through the central convex lens part.

6. The light irradiation apparatus according to claim 5, wherein a through hole is provided in the center of the concave lens and substantially all the light rays coming out from the central convex lens part are configured to pass through said through hole.

7. The light irradiation apparatus according to claim 5, wherein a uniform-thickness part is provided in the center of the concave-lens, and substantially all the light rays emitted from at least the central convex lens part are configured to pass through said uniform-thickness part.

8. The light irradiation apparatus according to claim 5, comprising a plurality of LEDs each having different emission color.

9. A light irradiation apparatus, comprising:

an LED, a solid optical unit with optical transparency that is in a shape of a widening-toward-end rotating body with a center of the optical axis of the light emitted from the LED, and makes the light from the LED pass through its inside and emit it from its apical surface; and a concave lens disposed in a further apical end of the optical unit; where the optical unit is so configured that a reflection plane for performing substantially total reflection of the light from the LED is formed on its side, and further comprising a position adjustment mechanism for setting a clearance between the concave lens and the optical unit along the optical axis direction to be variable, wherein the position adjustment mechanism makes the concave lens move relative to the optical unit between a clearance position that is a position at which the diameter of light emitted from the optical unit becomes a minimum or its neighbor and a proximity position that is set to a position nearer the optical unit than the clearance position, wherein a through hole is provided in the center of the concave lens, and substantially all the light rays coming out from the optical unit are configured to pass through said through hole at the clearance position.

10. A light irradiation apparatus, comprising:

a plurality of LEDs, a plurality of solid optical units positioned for optical transparency and corresponding to these LEDs, respectively;

a plurality of concave lenses, each corresponding to one of the solid optical units, are disposed at a distance from apical ends of the optical units;

wherein each of the optical units is so configured that a reflection plane for performing substantially total reflection of the light from the LED is formed on its side; and a position adjustment mechanism for setting a variable clearance between the concave lenses and the respective optical units along an optical axis direction, wherein the position adjustment mechanism includes a sliding mechanism that supports the concave lenses in such a manner that the concave lenses can be moved in parallel along the optical axis direction and a fixing mechanism for fixing the concave lenses at a desired position along the sliding mechanism, wherein the fixing mechanism includes a lens support that supports the concave lenses, an elastic member that is provided between the LEDs and a substrate for supporting the optical units to apply an elastic force to the lens support in a light emission direction, an engagement member that engages with a flange part of the lens support and sandwiches the lens support flange part between the engagement member and the elastic member, thereby holding the lens support and a screw-thread feed mechanism for moving the engagement member forwardly/backwardly along an optical axis direction, wherein the position adjustment mechanism uniformly alters the optical axis distance between the concave lenses and the optical units.

11. The light irradiation apparatus according to claim 10, wherein each optical unit is in a shape of a widening-toward-end rotating body with a center of the optical axis of the light emitted from the LED, and makes the light from the LED pass through its inside and be emitted from its apical surface, the optical unit is configured so that a base end recess for housing the LED is opened in a central part of its base end face, a central convex lens part is formed in the central part on its apical surface and a ring convex lens part of a curvature different from that of the central part has a convex lens part formed in the periphery thereof, and a curvilinear bulge surface acts as a reflection plane, for performing substantially total reflection of the light from the LED, is formed on a side of the optical unit, wherein, among the light rays emitted from the LED, substantially all the light rays passing through a side of the base end recess are configured to undergo total reflection on the curvilinear bulge surface and be emitted to an outside as mutually converging light rays through the ring convex lens part, while substantially all the light rays passing through the bottom of the base end recess are configured to be emitted to the outside as mutually converging light rays through the central convex lens part.

12. The light irradiation apparatus according to claim 10, wherein the position adjustment mechanism makes the concave lenses move relative to the respective optical units between a clearance position that is a position at which the diameter of light emitted from the optical unit becomes a minimum and a proximity position that is set to a position nearer the optical unit than the clearance position.

13. The light irradiation apparatus according to claim 12, wherein a through hole is provided in the center of the concave lens, and substantially all the light rays coming out from the optical unit are configured to pass through said through hole at the clearance position.

14. The light irradiation apparatus according to claim 11, wherein a through hole is provided in the center of the concave lens, and substantially all the light rays coming out from the optical unit are configured to pass through said through hole at the clearance position.

15. The light irradiation apparatus according to claim 12, wherein a uniform-thickness part is provided in the center of the concave lens, and substantially all the light rays emitted from the optical unit are configured to pass through said uniform-thickness part at the clearance position.

16. The light irradiation apparatus according to claim 11, wherein a uniform-thickness part is provided in the center of the concave lens, and substantially all the light rays emitted from the optical unit are configured to pass through said uniform-thickness part at the clearance position.

17. The light irradiation apparatus according to claim 10, comprising a plurality of LEDs each having different emission color.

* * * * *